(12) United States Patent
Mace et al.

(10) Patent No.: US 12,459,248 B2
(45) Date of Patent: *Nov. 4, 2025

(54) FLUID EJECTOR

(71) Applicant: ARCHIPELAGO TECHNOLOGY GROUP LTD., Cambridge (GB)

(72) Inventors: Daniel Richard Mace, Cambridge (GB); Neil Emerton, Cambridge (GB); David Alan Crooks, Cambridge (GB); Guy Charles Fernley Newcombe, Cambridge (GB); Charlotte Giverny Pamela Joy Stokes, Cambridge (GB); Theodore John Snudden, Cambridge (GB)

(73) Assignee: ARCHIPELAGO TECHNOLOGY GROUP LTD, Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 18/401,300

(22) Filed: Dec. 29, 2023

(65) Prior Publication Data

US 2024/0208204 A1 Jun. 27, 2024

Related U.S. Application Data

(63) Continuation of application No. 16/077,988, filed as application No. PCT/GB2017/050400 on Feb. 15, 2017, now Pat. No. 11,858,262.

(30) Foreign Application Priority Data

Feb. 16, 2016 (GB) ...................................... 1602743

(51) Int. Cl.
*B41J 2/02* (2006.01)
*B41J 2/14* (2006.01)

(52) U.S. Cl.
CPC . *B41J 2/02* (2013.01); *B41J 2/14* (2013.01); *B41J 2/14161* (2013.01); *B41J 2202/02* (2013.01)

(58) Field of Classification Search
CPC ... B41J 2/02; B41J 2/14; B41J 2/14161; B41J 2202/02
See application file for complete search history.

(56) References Cited

U.S. PATENT DOCUMENTS

| 4,608,577 A | 8/1986 | Hori |
| 4,667,595 A | 5/1987 | Geretzki |

(Continued)

FOREIGN PATENT DOCUMENTS

| CN | 1109689 | 10/1995 |
| CN | 102271922 | 12/2011 |

(Continued)

*Primary Examiner* — Geoffrey S Mruk
(74) *Attorney, Agent, or Firm* — FINNEGAN, HENDERSON, FARABOW, GARRETT & DUNNER, LLP

(57) ABSTRACT

A fluid ejector for ejecting discrete volumes of ejectant includes a body with opposing first and second surfaces. One or more nozzles are defined as conduits extending through the body between the surfaces to connect first and second orifices at the first and second surfaces respectively. The fluid ejector further includes a gas supply means having a gas outlet and an ejectant supply means. The ejectant supply means supplies the ejectant to the nozzles at a pressure above ambient via their supply orifices. The supply orifice is defined in a conduit's side or is the second orifice. Relative movement of the gas supply means and body exposes first orifices to the gas outlet allowing the gas supply means to supply gas at a pressure above ambient, wherein a pressure difference thereby created between the first and second orifices causes ejection of the ejectant from the nozzles through the second orifices.

22 Claims, 15 Drawing Sheets

(56) References Cited

U.S. PATENT DOCUMENTS

| | | |
|---|---|---|
| 5,150,651 A | 9/1992 | Flores |
| 5,389,148 A | 2/1995 | Matsunaga |
| 11,858,262 B2 * | 1/2024 | Mace .................. B41J 2/14161 |
| 2002/0033856 A1 | 3/2002 | Moon et al. |
| 2009/0085979 A1 | 4/2009 | Onozawa |

FOREIGN PATENT DOCUMENTS

| | | |
|---|---|---|
| JP | S61206661 A | 9/1986 |
| JP | S6244457 A | 2/1987 |
| JP | S6260693 A | 3/1987 |
| JP | S6471763 A | 3/1989 |
| JP | H 02-217249 A | 8/1990 |
| JP | H08252913 A | 10/1996 |
| JP | H 01-071763 A | 3/1998 |
| JP | 2007-075675 A | 3/2007 |
| JP | 2010131820 A | 6/2010 |
| KR | 2011-0130894 | 12/2011 |
| WO | WO0230576 A1 | 4/2002 |

* cited by examiner

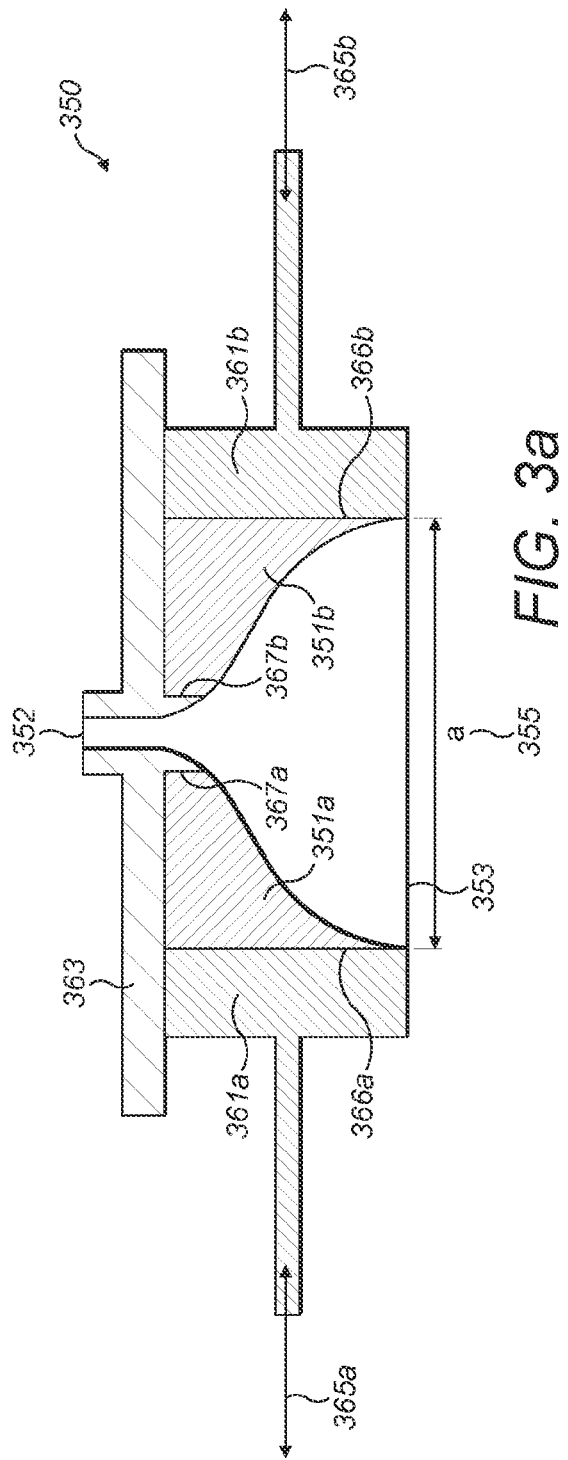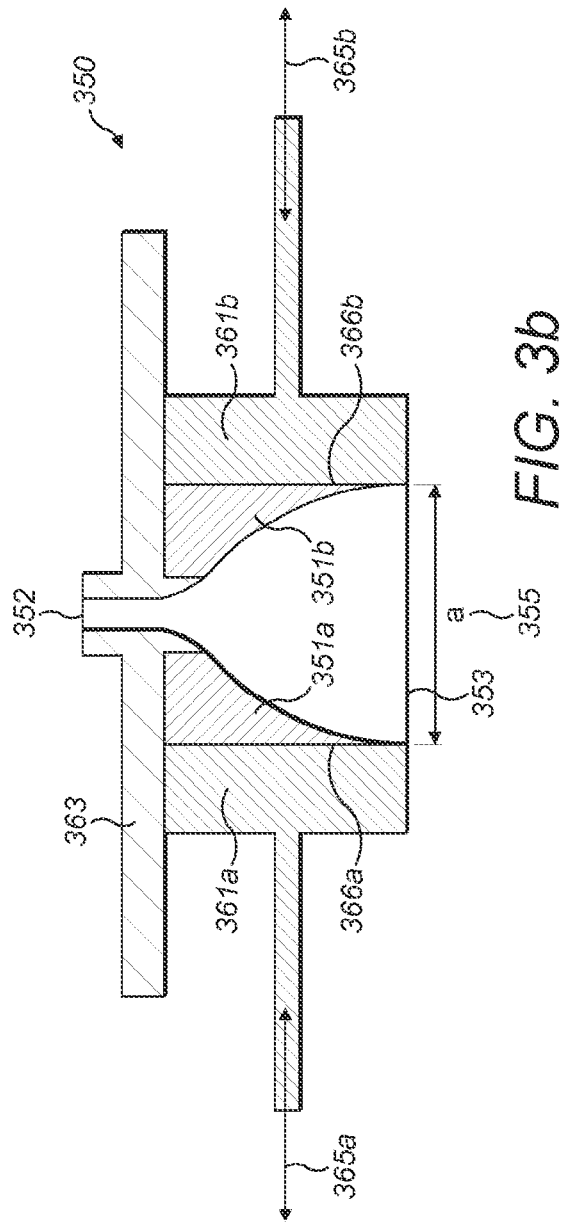

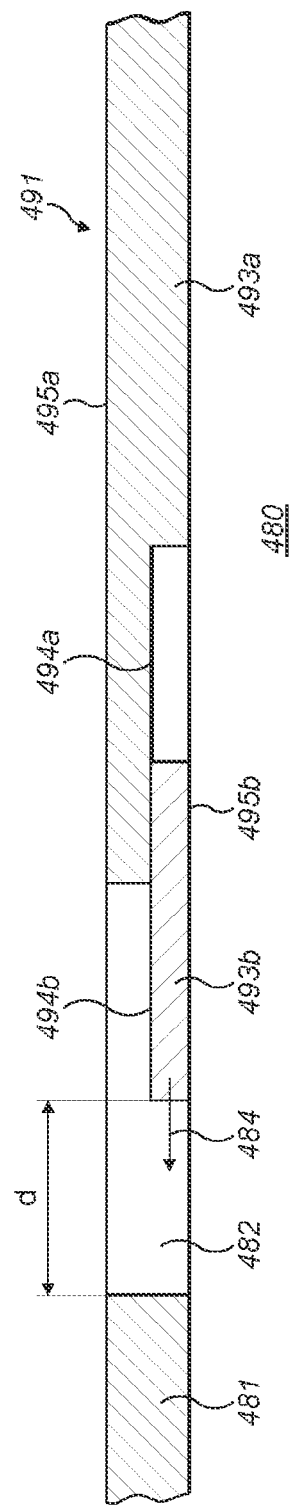

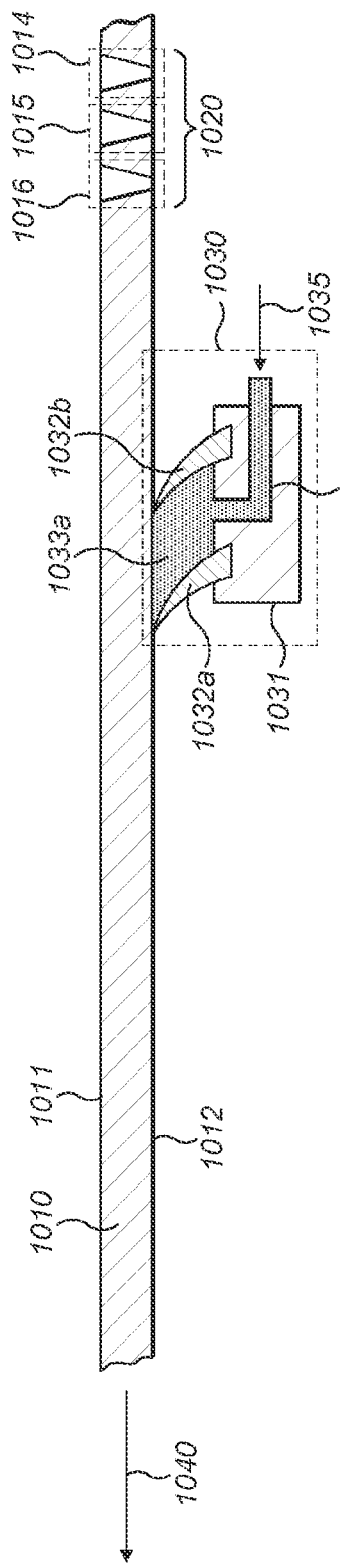
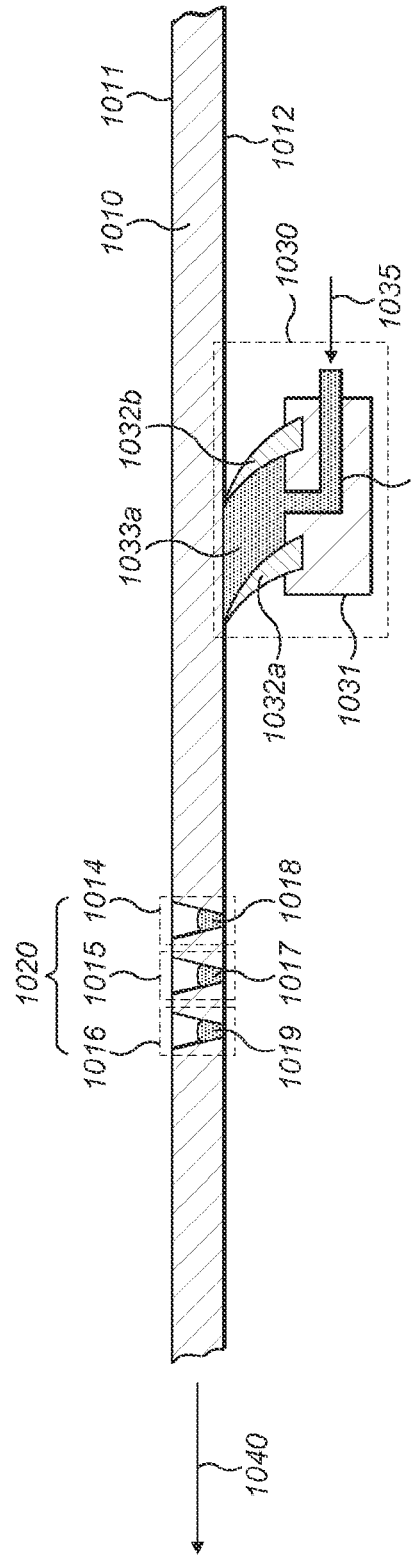
FIG. 10a
FIG. 10b

FLUID EJECTOR

CROSS-REFERENCE TO RELATED APPLICATIONS

This application is a continuation of U.S. patent application Ser. No. 16/077,988, filed Aug. 14, 2018, and issued on Jan. 2, 2024, as U.S. Pat. No. 11,858,262, which is a 371 national stage application of International Application No. PCT/GB2017/050400, filed Feb. 15, 2017, which designates the United States, and which claims the benefit of priority from GB Application No. 1602743.5, filed Feb. 16, 2016. The entire contents of each of these applications are incorporated herein by reference in their entirety.

FIELD OF THE INVENTION

The present invention relates to apparatuses and methods for dispensing flowable materials, such as liquids, and in particular to fluid ejectors and related methods that enable dispensing of a discrete quantity of fluids of various viscosities.

BACKGROUND OF THE INVENTION

Fluid ejectors (may also be referred to as "dispensers") are commonly adapted to eject (dispense) flowable materials (i.e., materials whose constituent parts or sub-volumes are capable of relative motion, such as ink), from a chamber and through one or more nozzles of the fluid ejector. Ejectants include liquid suspensions, emulsions, waxes, gels, and the like and are usually ejected in the form of droplets (i.e. volumes of liquid bounded, completely or almost completely, by free surface).

Ink-jet print-heads and industrial dispensers of fluids are examples of fluid ejectors (such as droplet dispensers) configured to eject liquid ejectants. A known type of droplet dispenser incorporates a piezoelectric actuator, which forms a wall of an ejection chamber filled with liquid ink and, in use, causes the wall to deflect against the ink so as to cause ejection of the ink. Another known type of droplet dispensers uses a resistive heating element placed within the ink-filled ejection chamber to heat locally the ink to a level sufficient to induce formation of a vapour bubble within the ink, thereby to cause ejection of the ink.

In such ink-jet droplet dispensers, ink displacement through an exit orifice of a nozzle leading from the interior of the ejection chamber to the external environment is induced by raising the pressure of the ink within the chamber whilst physically displacing the ink within the ejection chamber. When the combined pressure and displacement transients become sufficiently large, the volume and velocity of the ink displaced through the orifice become large enough to cause detachment of a portion of the displaced volume both from the ink remaining in the ejection chamber and from the orifice itself, thereby creating one or more ink droplets.

However, these known types of ink-jet droplet dispensers suffer from a number of drawbacks. For example, pressures that can be achieved by the above-described ink-jet actuation means are severely limited, thereby limiting the viscosities of the liquid ejectants that can be ejected by each ejection actuation of the droplet dispenser. Further, the actuation displacement limits within these ink-jet droplet dispensers limit the largest droplet volume that can be ejected.

Still further, the volumetric compressibility provided by bubbles within the ink reduces the magnitude of the pressure and liquid displacement transients. Since even small bubbles can prevent or inhibit droplet ejection, severe restrictions need to be imposed upon volume of any gas (e.g. air, nitrogen, oxygen, argon) or vapour bubbles existing within the ejection chamber of any such ink-jet droplet dispenser prior to actuation. Consequently, great care must be exercised in the design and manufacture of the known print-heads, the systems that feed ink to those print-heads, and their methods of use to ensure that, in use, the ejection chamber is filled with ink without pockets of gas or vapour whose total volume is more than a small fraction of the displacement volume provided by the actuation means. Similarly, the ink supplied for use with such print-heads undergoes processes designed to remove dissolved gases ('de-gassing') so that no gas comes out of the ink solution to form bubbles prior to actuation.

Even further, the pressure difference that causes replenishing 'refill' of the nozzle subsequent to ejection of liquid (e.g., ink), thereby enabling ejection of further droplets, is generally the surface tension of residual liquid within the nozzle. With conventional liquids and conventional diameters of ejection orifices, surface tension produces only a small refill force that must act against both the inertia and viscous drag presented by liquid in the ejection chamber, nozzle, and ink supply tubes. The rate at which droplets can be continuously (or semi-continuously) ejected is generally limited by this small force and factors including the geometry of the ejection chamber, nozzle, and liquid supply tubes and the liquid viscosity. This problem is particularly acute in array forms of such print heads, since the volume and spacing of the ejection chambers is then limited by the spacing of the nozzles, and long narrow capillaries are generally required to connect the ejectant supply to those ejection chambers.

The restrictions described above greatly reduce the range of flowable materials that can be ejected from the print heads, the ejected volume that can be achieved, and the rate of ejection that such ink-jet print-head devices can provide. The necessity to avoid even small quantities of any gas within the ejection chamber requires de-gassing of liquids, thus increasing the liquid manufacturing cost.

In a further example, ejection of single droplets of liquid is known to be achieved by sudden pressurisation of gas (and therefore of the liquid) in a chamber part-filled with liquid covering a droplet outlet and part-filled with gas in communication with a gas supply and a pressure-relieving gas vent. Ejection of multiple droplets is prevented by rapidly reducing the pressure via the vent before further ejection occurs.

However, this approach relies on maintaining careful balance between the timing of pressurisation pulses required for droplet ejection and the time duration required for pressure-reduction. These times are dependent upon a number of parameters, such as the fluid viscosity, size of the droplet outlet, the flow profile of the valve controlling the sudden gas pressurisation as the valve opens, the liquid fill level within the chamber, the ambient temperature, the elimination of reverberating pressure pulses within the chamber, and other factors. Therefore, this approach to fluid ejection is intolerant of varying operating conditions expected in practical industrial application.

One approach employed in glue and other liquid dispensers is to allow liquid glue to flow under gravitational pressure from a chamber to enter the outer orifice of a fixed volume nozzle (or nozzles) located at or near the terminus of a gas-transmitting capillary during the 'fill' part of the operation cycle of the dispenser. Then, during the subsequent 'ejection' part of the operation cycle, the volume of glue that entered the nozzle is ejected as a spray (or sprays) of glue droplets by applying a pressure pulse from the gas supply. In this way, viscous glue does not have to flow through long thin capillaries. Thus, the pressure needed for ejection is reduced and/or the upper limit of viscosities that can be ejected as droplets and/or the rate at which such droplets can be ejected is increased. However, the volume of glue entering the nozzle during the 'fill' part of the cycle, and therefore the volume subsequently ejected is not metered or controlled, making it difficult to provide for a volume required for a task at hand. Rather, more commonly, there is either too much or too little of the glue in the nozzle for the task at hand.

SUMMARY OF THE INVENTION

The devices and methods described herein provide for more effective and efficient technique for dispensing discrete quantities of fluids that is tolerant of varying operating conditions of practical industrial applications.

In the context of this disclosure, the term 'ejectant' encompasses any flowable material, such as those materials whose constituent parts or sub-volumes are capable of relative motion, and includes, but not limited to, liquids, liquid solutions, suspensions, emulsions, gels, and waxes. The term 'gas' encompasses a gas, mixture(s) of gases, a vapour, mixture(s) of vapours, and mixtures of vapour(s) and gas(es).

As understood by those skilled in art, the term 'ambient pressure' with reference to a particular object means the pressure on the object by the medium (environment) surrounding that object. The medium typically is air at atmospheric pressure, although it may differ. For example, an apparatus and/or a method according to the present invention may be practised inside fume cabinets filled with air but operated at pressures below atmospheric pressure and/or in environments filled with inert gases to prevent, for example, oxidation of materials within those environments. The present disclosure follows this conventional definition of the term 'ambient pressure'. In context of this definition, it should be understood that the term 'pressurised gas' as used herein refers to gas pressurised to a pressure above ambient pressure.

According to one aspect of the present invention, there is provided a fluid ejector for ejecting discrete volumes of ejectant, the fluid ejector comprising: a body having opposing first and second surfaces and at least one nozzle defined between the first and second surfaces, each of the at least one nozzle defined by a conduit extending through the body to connect a first orifice defined at the 10 first surface of the body and a second orifice defined at the second surface of the body; an ejectant supply means for supplying ejectant to each of one or more of the at least one nozzle via a supply orifice of the nozzle, wherein the supply orifice is the second orifice or is defined in a side of the conduit defining the nozzle; and a gas supply means for supplying a gas to the one or more nozzles through the one or more first orifices, the gas supply means defining a gas outlet, the gas supply means and the body movable relative to each other, wherein, in use: the ejectant supply means supplies the ejectant to each of the one or more nozzles at a pressure above ambient pressure, and relative movement of the gas supply means and the body exposes the one or more first orifices of the one or more nozzles to the gas outlet, enabling the gas supply means to supply gas to the one or more first orifices of the one or more nozzles at a pressure above ambient pressure, wherein, for each of the one or more nozzles, a pressure difference created thereby between the first orifice and the second orifice of the nozzle causes ejection of the ejectant from the nozzle through the second orifice.

This fluid ejector advantageously enables dispensing of discrete quantities of fluids in a manner that is tolerant of varying operating conditions of practical industrial applications.

Furthermore, the described fluid ejector extends the practical applications of ejection of discrete quantities of ejectants to a wider range of ejectants, a wider range of ejection rates, and a wider range of volumes of ejected ejectant than those known in the ink-jet art. By using a supply of pressurised gas, greater ejection energies can be provided than is provided by known ink-jet actuation means. Such use of pressurised gas also provides physical displacements of the ejectant that are larger than those provided by known ink-jet actuation means, thereby advantageously increasing the largest ejectant volume that can be ejected.

Additionally, for liquid ejectants, no effective removal of dissolved gases from the ejectant is required, whilst for viscous ejectants, the viscous forces opposing ejectant ejection can be minimised by, for example, feeding the ejectant directly into the conduit immediately adjacent the ejection orifice, rather than via long capillary feed tubes, as known in the art.

Further, for liquid ejectants, supply at a pressure above ambient pressure eliminates the reliance of the 'refill' of the nozzles after ejection upon the weak force of surface tension. This enables satisfactory supply (i) of liquid ejectants having a greater range of viscosities and therefore of a greater range of ejectant materials and/or (ii) of ejectants into a greater range of orifice and nozzle sizes and thereby a greater range of volumes of ejected ejectant and/or (iii) of ejectants at a faster rate than conventionally used.

In some example embodiments, the ejectant supply means and the body are movable relative to each other. Their relative movement (e.g., translation or rotation) enables filling of nozzles with the ejectant at one region of the body whilst simultaneously ejecting the ejectant from nozzles at a separate region of the body. This, in turn allows continuous and rapid operation of fluid ejectors.

This arrangement also allows the time period between filling of nozzle(s) and ejection from the nozzle(s) to be shortened, enabling satisfactory ejection of many kinds of suspensions which otherwise would sediment within the nozzle(s) due to prolonged time periods between filling and ejection. One example of filling of nozzle(s) with the ejectant at one region of the body while simultaneously ejecting the ejectant from nozzle(s) at a separate region of the body is a fluid ejector having a body in the form of a rotating annular roller together with a fixed gas supply head and a fixed ejectant supply means located at different positions relative to the roller (discussed below in greater detail).

In some example embodiments, the ejectant supply means comprises: an ejectant supply holder; and at least one resilient member extending from the ejectant supply holder and configured to provide for pressure-bearing contact between the resilient member and one of the first and second surfaces of the body such that, in use, the resilient member guides the ejectant into the one or more nozzles.

In some example embodiments, the at least one resilient member is further configured, in use, to remove an excess of the ejectant from the surface of the body contacted by the at least one resilient member.

In some example embodiments, the at least one resilient member comprises two resilient members extending from the ejectant supply holder to form a cavity for holding the ejectant, the ejectant supply assembly further defining a feed conduit that allows, in use, supply of the ejectant into the cavity at a pressure above ambient pressure, responsive to the presence of nozzles adjacent to the ejectant holding cavity.

In some example embodiments, the at least one resilient member is in pressure-bearing contact with the second surface of the body such that, in use, the resilient member guides the ejectant into the one or more nozzles through the respective second orifices.

In some example embodiments, for each of the one or more nozzles, the ejectant supply means comprises a metering device configured to supply the ejectant to the supply orifice defined in the side of the conduit defining the nozzle.

In some example embodiments, the body and/or the gas supply means are movable to cause the relative movement of the gas supply means and the body.

In some example embodiments, the gas supply means comprises a gas supply head defining the gas outlet for directing the gas to the first orifices of the one or more nozzles.

In some example embodiments, the gas supply head is configured to receive pulsatile supply of gas at a pressure above ambient pressure.

In some example embodiments, the gas supply head is configured to receive continuous supply of gas at a pressure above ambient pressure.

In some example embodiments, the gas supply head and the body are configured to move relative to each other so as to maintain a constant separation between the gas supply head and the body.

In some example embodiments, a dimension of the gas outlet in a direction of the relative movement of the gas supply head to the body is dynamically adjustable such that, in use, that dimension is adjusted to control a time duration of the one or more nozzles being exposed to the pressure of the gas at the gas outlet.

In some example embodiments, the constant separation defines a gap between a portion of the gas supply head defining the gas outlet and the first surface of the body.

In some example embodiments, the gap is such that, if nozzles that are exposed to the pressure of the gas at the gas outlet are empty, the gas flow through the gap is smaller than the gas flow through the exposed nozzles.

In some example embodiments, the gap is such that, if nozzles that are exposed to the pressure of the gas at the gas outlet are filled or partially filled with the ejectant, the gas flow through the gap is smaller than the gas flow through the exposed nozzles while ejecting the ejectant.

In some example embodiments, the discrete volumes of the ejected ejectant are limited by the interior volume of the one or more nozzles.

In some example embodiments, the body is a rotatable annular roller and the relative movement of the gas supply means and the body is caused by rotation of the rotatable annular roller.

In some example embodiments, the body is a plate.

In some example embodiments, the fluid ejector further comprises: an aperture member, defining at least one aperture and positioned between the body and the gas supply means, wherein the aperture member is movable such that, in use: for supplying the ejectant to the one or more nozzles, the aperture member is movable to a position in which the aperture member prevents exposure of the one or more nozzles to the pressure of the gas from the gas supply means, and for ejecting the ejectant from the one or more nozzles, the aperture member is movable to a position in which the at least one aperture of the aperture member is aligned with the one or more nozzles to expose the one or more nozzles to the pressure of the gas from the gas supply means.

According to another aspect of the present invention, there is provided a method for ejecting discrete volumes of ejectant, the method comprising: ejecting the ejectant onto a substrate or a web using any of the fluid ejectors discussed above.

In some example embodiments, ejecting comprises: supplying the ejectant to the one or more nozzles from the ejectant supply means; and supplying the gas to the one or more nozzles through the respective one or more first orifices at a pressure above ambient pressure, wherein a pressure difference created thereby between the one or more first orifices and the one or more second orifices respectively causes ejection of the ejectant from the respective nozzle through the second orifices.

In some example embodiments, each of the supply orifices is the second orifice and supplying the ejectant comprises: moving the body and the ejectant supply means relative to each other to expose the second orifices of the one or more nozzles to supply of the ejectant from the ejectant supply means.

In some example embodiments, each of the supply orifices is defined in the side of the conduit of the corresponding nozzle and the ejectant is supplied using a metering device.

In some example embodiments, supplying the gas comprises: moving the gas supply means and the body relative to each other to expose the first orifices of the one or more nozzles to the pressure of the gas from the gas supply means, thereby causing the nozzles to eject the ejectant from the one or more nozzles through the respective second orifices.

In some example embodiments, the method further comprises: repeating the supplying the ejectant and supplying the gas steps at least once.

According to the third aspect of the present invention there is provided a method for ejecting discrete volumes of ejectant, the method comprising: supplying with ejectant one or more nozzles of at least one nozzle defined in a body between opposing first and second surfaces of the body, each of the at least one nozzle defined by a conduit extending through the body to connect a first orifice defined at the first surface of the body and a second orifice defined at the second surface of the body, wherein the ejectant is supplied at a pressure above ambient pressure to each of the one or more nozzles through a supply orifice of the nozzle, the supply orifice being the second orifice or is defined in a side of the conduit defining the nozzle; and moving the gas supply means and the body relative to each other to expose the one or more first orifices of the one or more nozzles to a gas outlet defined by the supply means for supplying the gas at a pressure above the ambient pressure to the one or more nozzles, wherein for each first orifice exposed to the gas outlet, a pressure difference created thereby between the first orifice and the corresponding second orifice causes ejection of the ejectant from the respective nozzle through the second orifice.

In some example embodiments, the ejectant is supplied to the one or more nozzles using an ejectant supply assembly, and the method further comprises: moving the ejectant supply assembly and the body relative to each other to allow supply of the ejectant from the ejectant supply assembly to each of the one or more nozzles through the second orifice of the nozzle.

In some example embodiments, moving the ejectant supply assembly and the body relative to each other comprises one or more of: moving the body to cause the relative movement of the ejectant supply assembly and the body, or moving the ejectant supply assembly to cause the relative movement of the ejectant supply assembly and the body.

In some example embodiments, the ejectant supply assembly comprises an ejectant supply holder and at least one resilient member extending from the ejectant supply holder and configured to provide for pressure-bearing contact between the resilient member and the second surface of the body; and moving the ejectant supply assembly and the body relative to each other causes the at least one resilient member to pass over the second orifices, thereby guiding the ejectant into the one or more nozzles through the second orifices.

In some example embodiments, the method further comprises: removing an excess of the ejectant supplied to the one or more nozzles from the second surface by the at least one resilient member using the at least one resilient member.

In some example embodiments, wherein the at least one resilient member comprises two resilient members extending from the ejectant supply holder to form a cavity for holding the ejectant, the ejectant supply assembly further defining a feed conduit, the method further comprises: supplying the ejectant into the cavity at a pressure above ambient pressure, responsive to the presence of nozzles adjacent to the ejectant holding cavity.

In some example embodiments, supplying one or more nozzles with the ejectant comprises: for each of the one or more nozzles, using a metering device to supply the ejectant through the supply orifice defined in the side of the conduit defined in the nozzle.

In some example embodiments, the gas is supplied to the one or more nozzles by a gas supply head adjacent to the first surface of the body, the gas supply head defining the gas outlet for directing the gas to the first orifices of the one or more nozzles.

In some example embodiments, the method further comprises: receiving by the gas supply head pulsatile supply of gas at a pressure above ambient pressure.

In some example embodiments, the method further comprises: receiving, by the gas supply head, continuous supply of gas at a pressure above ambient pressure.

In some example embodiments, the relative movement of the body and the gas supply head causes the gas outlet to pass over the first orifices of the one or more nozzles.

In some example embodiments, moving the gas supply means and the body relative to each other comprises: moving the body to cause relative movement of the gas supply head and the body, and/or moving the gas supply head to cause the relative movement of the gas supply head and the body.

In some example embodiments, the method further comprises adjusting dynamically, in response to a speed of the relative movement of the gas supply head to the body, a dimension of the gas outlet in a direction of the relative movement of the gas supply head to the body to control a time duration of the one or more nozzles being exposed to the pressure of the gas at the gas outlet.

In some example embodiments, the gas supply head and the body are moved relative to each other such as to maintain a constant separation between the gas supply head and the body.

In some example embodiments, the constant separation defines a gap between a portion of the gas supply head defining the gas outlet and the first surface of the body.

In some example embodiments, the gap is such that, if nozzles exposed to the gas outlet are empty, the gas flow through the gap is smaller than the gas flow through the exposed nozzles.

In some example embodiments, the gap is such that, if the nozzles exposed to the gas outlet filled or partially-filled with the ejectant, the gas flow through the gap is smaller than the gas flow through the exposed nozzles while ejecting the ejectant.

In some example embodiments, the method further comprises: repeating at least once the steps of supplying the ejectant and moving the gas supply means and the body relative to each other.

In some example embodiments, the discrete volumes of the ejectant ejected from the one or more nozzles are limited by the interior volume of the one or more nozzles.

In some example embodiments, the body is a rotatable annular roller, and the method further comprises rotating the annular roller to cause the relative movement of the gas supply means and the body.

In some example embodiments, the body is a rotatable annular roller and the annular roller is rotated to allow supply of ejectant to the one or more nozzles.

In some example embodiments, the body is a plate.

In some example embodiments, an aperture member, having at least one aperture, is disposed between the body and the gas supply head, wherein the aperture member is movable, and the method further comprises: moving the aperture member to a position in which the aperture member prevents exposure of the one or more nozzles to the pressure of the gas from a gas supply means to allow supply of ejectant to the one or more nozzles; and moving the aperture member to a position in which the at least one aperture of the aperture member is aligned with the one or more nozzles to expose the one or more nozzles to the pressure of the gas from the gas supply means to cause ejection of the ejectant from the one or more nozzles.

BRIEF DESCRIPTION OF THE DRAWINGS

Examples of the present invention will now be described in detail with reference to the accompanying drawings, in which:

FIGS. 3a and 3b shows schematically a gas supply head suitable for use in the apparatus shown in FIGS. 1a, 1b, and 1c, according to some embodiments;

FIG. 4b shows schematically a cross-section of a composite aperture plate of a variable width suitable for use in the apparatus shown in FIG. 4a, according to some embodiments;

FIGS. 10a and 10b show schematically an ejectant supply assembly suitable for use in a device in a device for ejecting discrete quantities of ejectant, such as the device discussed with reference to FIGS. 1a, 1b, and 1c, according to some embodiments.

DETAILED DESCRIPTION

Embodiments of the invention provide a new technique for dispensing discrete quantities of fluids of various flow properties, such as viscosities. For greater understanding, a new fluid ejector, its variations and operation thereof, and associated methods are now described with reference to FIGS. 1a, 1b, 1c, 2, 3a, 3b, 4, 5a, 5b, 5c, 6, 7a, 7b, 8, 9, 10a, 10b, and 11.

Figure 1A:
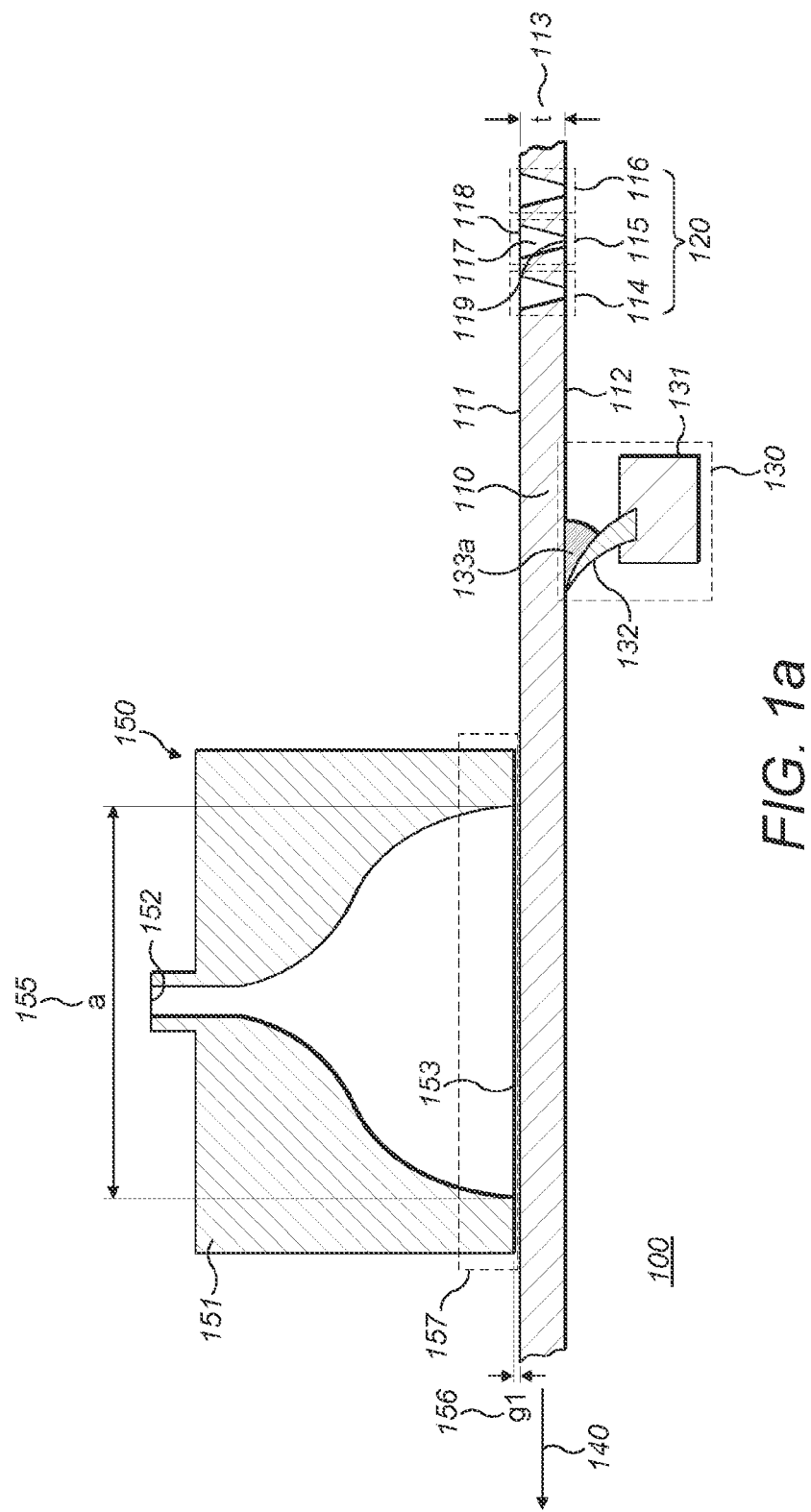
FIGS. 1a, 1b, and 1c show schematically a cross-section of an apparatus for ejecting a pattern of discrete volumes of ejectant, at different stages of operation, according to some embodiments.

FIG. 1a shows schematically a cross-section of an apparatus 100 (also referred to as a device, a fluid ejector, and an ejector) for ejecting therefrom a pattern of discrete volumes of ejectant. The apparatus 100 includes a body 110, an ejectant supply assembly 130, a gas supply head 150, and translation means (not shown) for translating the body 110 relative to the ejectant supply assembly 130 and/or gas supply head 150, for example, for translating the body 110 in the general direction of arrow 140 shown in FIG. 1a.

The body 110 has a first surface 111 and a second surface 112, opposite the first surface 111, which are separated by a thickness 113—shown as 't'. The body 110 is perforated to form a pattern 120 of nozzles 114, 115, and 116 within the body 110. In particular, each nozzle is defined by a conduit extending through the thickness 113 of the body 110 and connecting corresponding orifices defined at the first surface 111 and the second surface 112 of the body 110. For example, the nozzle 115 is defined by a conduit 117 connecting a first orifice 118 defined at the first surface 111 and a second orifice 119 defined at the second surface 112. Other nozzles defined within the body 110, such as nozzles 115 and 116 shown in FIG. 1a, are similarly structured.

Figure 1B:
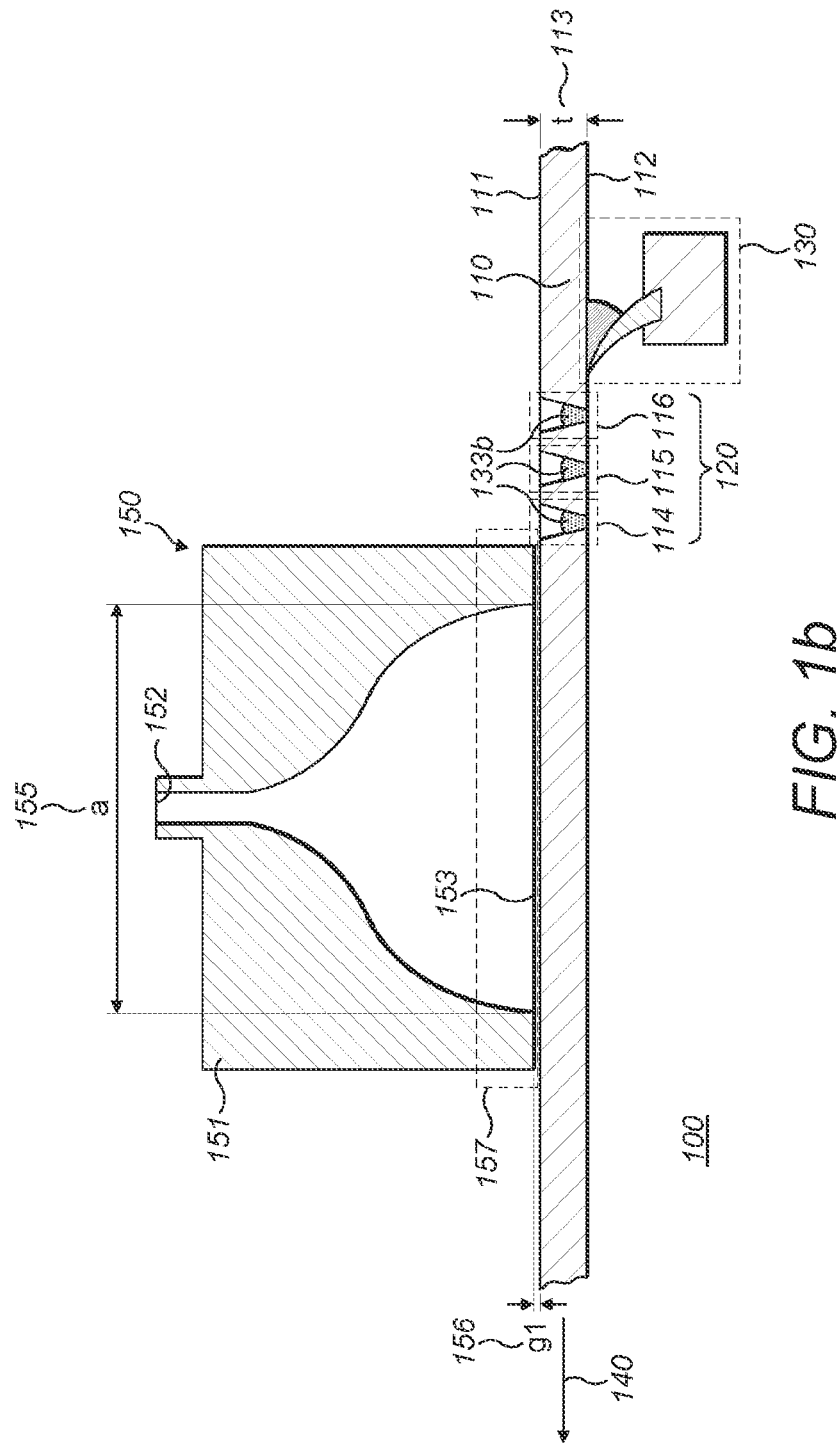
Figure 1C:
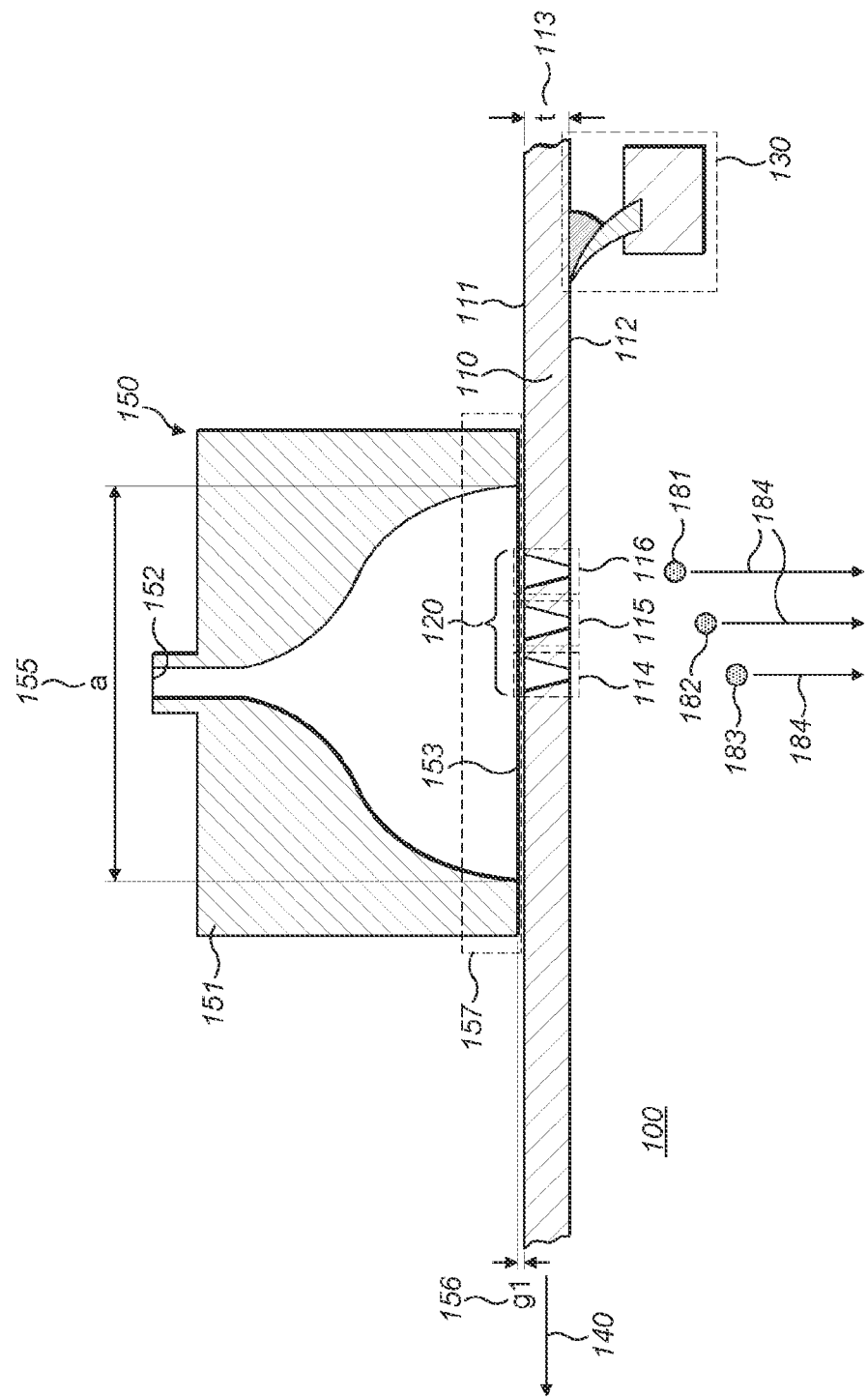

The ejectant supply assembly 130 includes a holder 131 and a resilient seal member 132 (e.g., a wiper blade seal) that extends from the holder 131. As can be seen in FIGS. 1a to 1c, the holder 131 is configured to be placed proximate to second surface 112 of the body 110 so as to provide for a pressure-bearing contact between the resilient seal member 132 and the second surface 112.

In use, an ejectant 133a is deposited between the resilient seal member 132 and the second surface 112 such that as the holder 131 along with the resilient seal member 132 travels relative to the body 110, the ejectant 133a travels along the second surface 112, for example, in the direction opposite of the direction indicated by the arrow 140. Thus, in use the ejectant 133a is in contact with the resilient seal member 132 and a portion of the second surface 112 that has not yet passed the resilient seal member 132 in the direction 140.

In some example embodiments, a single-use volume of the ejectant 133a is deposited between the resilient seal member 132 and the second surface 112 so as to enable refill of the nozzles 114, 115, and 116 of the nozzle pattern 120 via their second (supply) orifices during a single pass of the body 110 relative to the ejectant supply assembly 130. In some example embodiments however a multiple-use (e.g., on-demand) ejectant supply is provided, for example, as discussed in greater detail with reference to FIGS. 5a and 5b and FIGS. 10a and 10b.

The relative translation (movement) of the body 110 to the ejectant supply assembly 130 in the direction 140 causes resilient seal member 132 to move the ejectant 133a over the second surface 112 of body 110. This movement, together with the drag force between the ejectant 133a and the body 110 (for example, the viscous drag force if the ejectant is a fluid), causes a pressure gradient to be generated in the ejectant volume such that the pressure in that portion of the ejectant 133a adjacent to the resilient seal member 132 rises above ambient pressure. Consequently, as that portion of the ejectant 133a passes over the second orifices of the nozzles 114, 115, and 116, it is pushed into the nozzles 114, 115, and 116, such as shown in FIG. 1b at 133b. The relative translation of the body 110 also leaves the portion of the second surface 112, which has passed the resilient seal member 132, substantially free from the ejectant. In this manner, the ejectant supply assembly 130 partially or wholly fills the nozzles 114, 115, and 116 with a discrete quantity of the ejectant 133a.

The degree to which the nozzles 114, 115, and 116 are filled generally depends on the material of the resilient seal member 132, the angle between the resilient seal member 132 and the second surface 112, the relative speed of the second surface 112 to the resilient seal member 132, the geometry of the nozzles 114, 115, and 116, and the properties of the ejectant 133a, such as, in the case of liquid ejectants, viscosity and surface tension. For example, the nozzles 114, 115, and 116 can be completely filled with the ejectant 133a under the following conditions: the resilient seal member 132 is made of Polyvinyl Chloride (PVC) and has thickness of 0.5 mm and a length of 20 mm. The resilient seal member is placed at an angle of 20 degrees or less in relation to the second surface 112, the relative speed of the second surface 112 to the resilient seal member 132 is 3 cm/s, the ejectant 133a has viscosity of $10^7$ mPas at shear rate 0.001 $s^{-1}$ and viscosity of $10^3$ mPas at shear rate of 10 $s^{-1}$, the diameter of the nozzles 114, 115, and 116 at the second surface 112 is 0.5 mm, and the thickness 113 of the body 110 is 1.4 mm. To fill the nozzles 114, 115, and 116 only partially, the angle between the resilient seal member 132 and the second surface 112 needs to be increased.

The apparatus 100 further includes a gas supply head 150 that in use is positioned adjacent to the first surface 111 of the body 110. The gas supply head 150 is formed of solid walls 151, which define a gas outlet 153 and a gas inlet 152. Generally, the gas supply head 150 receives gas through the gas inlet 152 and outputs the gas through the gas outlet 153. The gas outlet 153 is defined at an end portion 157 of the gas supply head 150 that is adjacent to the body 110 whilst the gas inlet 152 can substantially be defined at any portion of the gas supply head 150, other than the gas outlet itself. In FIG. 1a, the gas inlet 152 is shown to be formed at an end portion of the gas supply head 150 that is opposite the end portion 157.

The gas outlet 153 may take different shapes. However, its dimensions in a plane substantially corresponding (e.g., parallel) to the plane of the first surface 111, such as its width 155 identified as 'a' and length, and/or a diameter, should preferably be greater than those of the largest first orifice within the pattern 120 of the nozzles 114, 115, and 116, so as to encompass the largest orifice when the gas outlet and the orifice are aligned.

Further translation of the body 110 relative to the ejectant supply assembly 130 in the direction 140 also provides translation of the body 110 relative to the gas supply head 150. Such translation results in one or more of the nozzles 114, 115, and 116 passing under the gas outlet 153, and thus being exposed to the pressure of gas at the gas outlet 153, as shown in FIG. 1c. The time set for this further translation is selected to be sufficiently short so as to retain the ejectant 133b within the nozzles 114, 115, and 116. The flow properties, such as, in the case of liquid ejectants, the viscosity and/or surface tension of the ejectant 133b, allow the nozzles 114, 115, and 116 to retain the ejectant 133b therein.

In use, an external supply of gas (not shown) supplies gas into the gas inlet 152 at a pressure sufficiently above ambient pressure. When one or more of the nozzles 114, 115, and 116 become exposed to the pressure of gas at the gas outlet 153, that pressure causes ejection of the ejectant 133b from the nozzles 114, 115, and 116. In particular, the ejection is caused by the pressure difference created between respective orifices of each nozzle due to the pressurised gas supplied from the gas outlet 153. The time duration of exposure to the gas pressure required to cause ejection of the ejectant from a nozzle may differ depending on, for the example, the pressure of the supplied gas (pressurised gas), dimensions of the nozzle, and/or the flow characteristics and volume of the ejectant.

As stated above, the pressure within the gas supply head 150 may be achieved by the supply of gas at a pressure above ambient pressure to the gas supply head 150. That pressure may be continuous (not varying with time) or pulsatile (time-varying). In the apparatus 100 with a pulsatile pressurisation of gas, the pressure pulses are timed to coincide with the times at which the nozzles are exposed to the gas at the gas outlet 153. The gas is supplied at a pressure above ambient during each pulse and at a pressure above the gas pressure between successive pulses.

Such gas pressure pulses may for example be provided using a supply of continuously pressurised gas in combination with an electrically controllable gas valve (not shown) positioned between the gas inlet 152 and an external gas supply (not shown), preferably adjacent to the gas inlet 152. Such a gas valve should be capable of rapid opening and closing (for example, opening within 100 milliseconds and closing within a further 100 milliseconds). Spool valves operated by solenoid actuators are suitable for this purpose.

The apparatus 100 with continuous and/or pulsatile supply of gas under pressure can deposit thereby a pattern of discrete volumes of ejectant upon a substrate.

For uniform ejection of the ejectant from all nozzles, it is preferable to keep the gas pressure (whether continuous or pulsatile) substantially uniform at the gas outlet 153 (where the nozzles 114, 115, and 116 are exposed to that pressure).

For many applications, the gas outlet 153 has a rather small width 'a' (for example 2 mm), whilst its length may extend substantially (for example 100 mm), in the perpendicular direction (i.e., normal to the cross-section shown in FIGS. 1a, 1b and 1c). Adequately uniform pressure can be obtained in this configuration whilst operating using continuous pressure, by using multiple gas inlets (not shown) distributed along a path corresponding to the length of the gas outlet 153 and connected to a common pressurised gas supply. If pulsatile pressure is used instead, then additionally, it is preferable to maintain the frequency of pressure pulses at frequencies lower than that frequency at which half the wavelength of sound in the gas within gas supply head 150 equals the smallest cross-sectional (width) dimension of gas supply head 150.

In some embodiments, to minimise gas consumption by the apparatus 100, the gas outlet 153 and the first surface 111 of the body 110 are maintained in close proximity. In particular, a gap 'g1', shown at 156, between the gas outlet 153 and the first surface 111 is characterised by a small value, whenever gas is supplied under pressure to the gas supply head 150. Preferably, the small value is selected such that the flow of gas through the gap 'g1' is smaller than the flow of gas through the nozzles when the nozzles are empty. Further preferably, the small value is selected such that the flow of gas through the gap 'g1' is smaller than the flow of gas through the nozzles when ejecting ejectant. By surrounding the gas outlet 153 with a sliding seal (not shown) between the gas supply head 150 and first surface 111, the gap 'g1' may be set to zero.

In a general case, however, the gap 'g1' is non-zero, and thus the pressure versus flow rate characteristic of the gas supply is selected to ensure that the gas pressure at the gas outlet 153 remains sufficiently above ambient pressure to eject the ejectant 133b from the nozzles 114, 115, and 116. The gas may be any compound that is in gaseous phase at the operating temperature of the apparatus and which does not have deleterious reaction with the ejectant 133b or materials of the gas supply head 150. In many practical applications, the gas can include for example compressed air, nitrogen, or pressurised steam.

Further, for some applications, it is preferable to keep the gas pressure inside the gas supply head 150 constant and uniform throughout the inner volume of the gas supply head 150. This can for example be achieved by making the physical dimensions of the interior of the gas supply head smaller than a half of the wavelength of sound where the wavelength is calculated at frequency of the pulsing operation of the gas supply.

Referring to FIG. 1c, in an example scenario, the ejectant 133b is a liquid of high viscosity (e.g., in the range 100 mPas to $10^8$ mPas). The gas pressure inside the gas supply head lies in the range $7 \times 10^3$ N/m² to $1 \times 10^6$ N/m². The first and second orifices 118 and 119 of the nozzles at the first and second surfaces 111 and 112 respectively are both chosen to have diameter 500 micrometres. The ejectant is exposed to the ejecting gas pressure for a time period in the range of 1 ms to 100 ms. The thickness t' of the body 110 is 1.5 mm. Under these conditions, the ejectant 133b would typically be ejected from the nozzles 114, 115, and 116, through the orifices at the second surface 112.

In the apparatus shown in FIG. 1c, the nozzles 114, 115, and 116 direct ejections of the ejectant in a substantially common direction 184 as shown at 181, 182, and 183. However, certain applications may require the nozzles 114, 115, and 116 to have different directionalities (e.g., different inclines within the body 110 with reference to the first and second surfaces) such that the ejections from the nozzles 114, 115, and 116 will not follow the common direction.

Although as described FIGS. 1a to 1c show an ejector which has the gas supply head and the body movable relative to each other, in some embodiments, the position of the gas supply head is fixed (stationary) in relation to the body. This arrangement is particularly suitable for ejecting ejectants onto a conveyer system with a substrate, web, or the like continuously or intermittently moving in relation to the nozzles defined within a body of the ejector, thereby enabling the ejector to deposit the ejectant onto new sections of the substrate, web, or the like.

Figure 2:
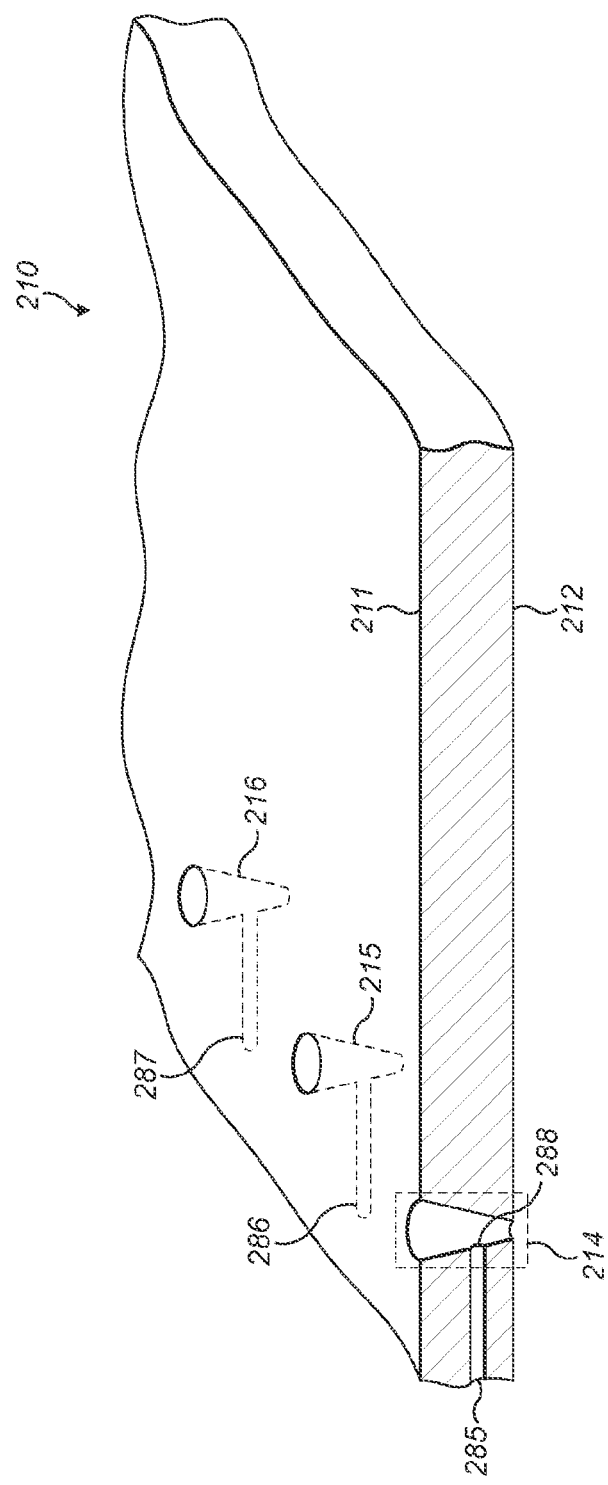
FIG. 2 shows schematically a body suitable for use with the apparatus shown in FIGS. 1a, 1b, and 1c, according to some embodiments.

FIG. 2 shows schematically a body 210 suitable for use in the apparatus 100 discussed in respect of FIGS. 1a to 1c, in accordance with some embodiments. Similar to the body 110, the body 210 is perforated to form a pattern of nozzles, within the body 210, such as nozzles 214, 215, and 216. In particular, each nozzle is defined by a conduit extending through the thickness of the body 210 to connect corresponding orifices defined at a first surface 211 and a second surface 212 of the body 210.

However, unlike the body 110, the body 210 also defines a number of side conduits formed therein for supplying ejectant into the nozzles 214, 215, and 216. For example, as shown in FIG. 2, a side conduit 285 is defined within the body 210 and connects to an auxiliary orifice 288 formed in a sidewall of the conduit of the nozzle 214. The nozzles 215 and 216 have similar auxiliary orifices to which side conduits 286 and 287 respectively connect. Each of the side conduits 285, 286, and 287 then can be used to fill each of the nozzles 214, 215, and 216 respectively via their respective auxiliary (supply) orifices. The ejectant 133b can for example be supplied to the side conduits 285, 286, and 287 using a metering device such as a syringe pump (not shown). This arrangement is most practical when using liquid ejectants.

An example of a device suitable for refilling the nozzles 214, 215, and 216 via their respective side conduits is discussed in greater detail with reference to FIG. 9. This approach to filling the nozzles is particularly suited for applications that require highly accurate reproducibility of liquid ejectant volume. Further, using the body 210 instead of the body 110 in the apparatus 100 and the respective ejectant supply method to fill in the nozzles provides for a variation of the apparatus 100 that does not require the ejectant supply assembly 130. The gas supply head 150 and ejection method described in relation to FIGS. 1a to 1c however can still be used in the variation of the apparatus 100 of FIGS. 1a to 1c using the body 210 of FIG. 2.

FIGS. 3a and 3b show a gas supply head 350 suitable for use in the apparatus 100 discussed with reference to FIGS. 1a to 1c, in accordance with some embodiments. Generally, unlike the gas supply head 150 shown in FIGS. 1a to 1c, the size of the gas supply head 350 is dynamically adjustable, such as whilst the apparatus 100 is being used.

More specifically, the gas supply head 350 is formed of a composite assembly of an elongated solid body 363 having a gas inlet 352 defined therein, compressible bodies 351a and 351b, and piston elements 361a and 361b. The compressible bodies 351a and 351b are adapted to cooperate with each other and the body 363 so as to form an internal cavity of the gas supply head 350 having the gas inlet 352 and defining a gas outlet 353.

The compressible bodies 351a and 351b are bonded to the piston elements 361a and 361b respectively, one side, forming corresponding bonds 366a and 366b, and to the solid body 363 on the other side, forming bonds 367a and 367b respectively. In the gas supply head 350 of FIG. 3, the bonds 367a and 367b are adjacent to the gas inlet 352. There is no other bond between the compressible bodies 351a and 351b and the solid body 363 in the gas supply head of FIGS. 3a and 3b.

The piston elements 361a and 361b are displaceable by actuation means (not shown) towards each other and away from each other, shown in FIGS. 3a and 3b as directions 365a and 365b for the piston elements 361a and 361b respectively, thereby compressing and expanding the compressible bodies 351a and 352b. The compressible bodies 351a and 352b are formed of material(s) having a desired level of compressibility, which include but are not limited to, closed-cell elastic foam and/or flexible structures in the form of bellows.

To enable controlled displacement of the piston elements 361a and 361b, the solid body 363 may be provided with guides (not shown) to link the piston elements 361a and 361b to the body 363 and guide their displacement along the body 363. As shown in FIG. 3b, actuation of the actuation means to displace the piston elements 361a and 361b towards each other causes compression of the compressible bodies 351a and 352b, thereby reducing the width 'a' (shown at 355), and consequently the inner volume of the gas outlet 353.

The width 'a' of the gas outlet 353 can be adjusted dynamically in response to the speed of the relative translation between the gas outlet 353 and the body 110 of the apparatus 100, as discussed with reference to FIGS. 1a to 1c. In this manner, it is possible to achieve, within a range of such relative speeds (e.g., from 0.1 m/s to 10 m/s), substantially constant time duration of exposure of ejectant within a nozzle to the pressure of the supply gas, independent from the relative speed of the gas outlet 353 to the body 110 while supplying gas to the gas supply head 350 at constant pressure. Thus, consistent ejection behaviour of the ejectant can be provided (e.g. consistent ejection speed and/or, in case of liquid ejectant, consistent ejection as a single droplet of ejectant, rather than as a spray of droplets) substantially independently of the speed of the relative motion and without the need to use sources of gas capable of providing variable pressure or pressure pulses. This approach can be particularly beneficial in scenarios where ejectant patterns are deposited onto substrate(s) moving with a variable speed, e.g., during the speed-up and slow-down of a web on a production line. Width 'a' of the gas outlet 353 can be controlled using a control circuit that uses the speed of the web on a production line derived from an encoder or similar measuring device to control a motor that moves the piston elements 361a and 361b. In this way, the width 'a' of the gas outlet 353 can be continuously controlled in response to the web speed on a production line.

In FIGS. 3a and 3b, the compressible gas supply head 350 is shown to comprise two compressible bodies 351a and 351b. However, the compressible gas supply head may comprise a single compressible body or instead comprise more than two compressible bodies, e.g., 3 or 4 compressible bodies. Furthermore, fewer or more than two pistons 361a and 361b may be employed to compress the gas supply head 350.

Figure 4A:
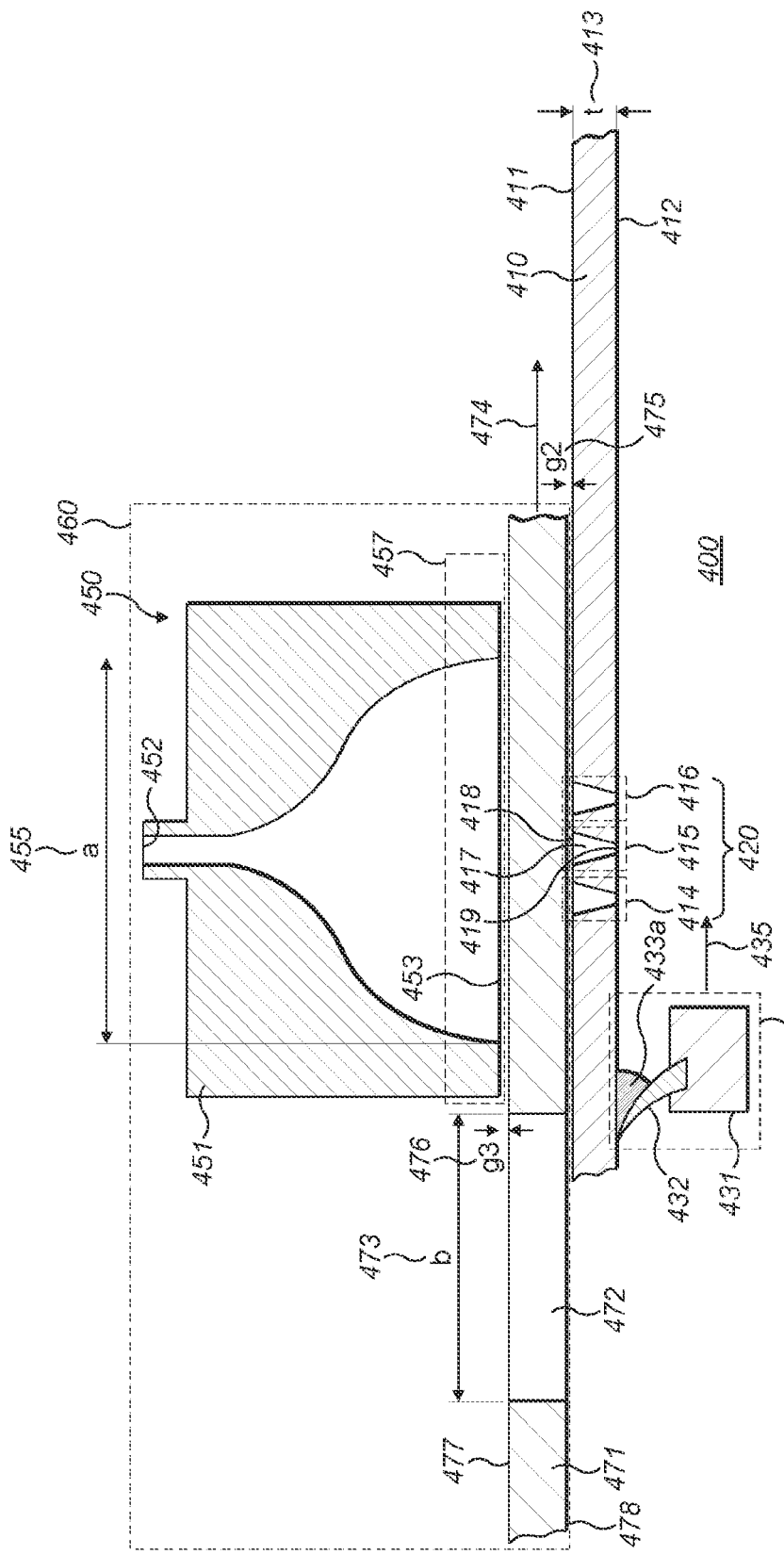
FIG. 4a shows schematically a cross-section of an apparatus for ejecting a pattern of discrete volumes of ejectant, according to some other embodiments.

FIG. 4a shows schematically a cross-section of another apparatus 400 for ejecting a pattern of discrete volumes of ejectant, according to some embodiments.

Generally, the apparatus 400 is a variation of the apparatus 100 described with reference to FIGS. 1a to 1c that includes many of the functional components described in respect of FIGS. 1a to 1c. More specifically, similar to the apparatus 100, the apparatus 400 has a body, an ejectant supply assembly, and a gas supply head identified respectively as 410, 430, and 450, and translation means (not shown) for translating the ejectant supply assembly 430 and the body 410 relative to each other.

Similar to the body 110 of the apparatus 100, the body 410 has a first surface 411 and a second surface 412, opposite the first surface 411, which are separated by a thickness 413—shown as 't'. The body 410 is perforated to form a pattern 420 of nozzles 414, 415, and 416 within the body 410. Each nozzle is defined by a conduit extending through the thickness 413 to connect corresponding orifices defined at the first surface 411 and the second surface 412 of the body 410. For example, the nozzle 415 is defined by a conduit 417 connecting a first orifice 418 defined at the first surface 411 and a second orifice 419 defined at the second surface 412. The other nozzles defined within the body 410, such as nozzles 414 and 416 shown in FIG. 4, are similarly structured.

Similar to the ejectant supply assembly 130 of the apparatus 100, the ejectant supply assembly 430 comprises an ejectant supply body 431 configured to hold ejectant 433a, such as an ejectant liquid, and a resilient seal member 432 that extends from the ejectant supply body 431. As can be seen in FIG. 4a, the ejectant supply assembly 430 is configured to be placed adjacent to the body 410 so as to provide for a pressure-bearing contact between the resilient seal member 432 and the second surface 412 of the body 410.

However, unlike the apparatus 100, in the apparatus 400, a further component of an aperture member is provided for use in combination with the gas supply head 450, together forming a gas supply head system 460. In FIG. 4a, this further component is shown in the form of a translatable aperture plate 471 having opposite surfaces 477 and 478 and an aperture 472 defined therethrough. The plate 471 is positioned between the gas supply head 450 and the body 410.

In the apparatus 400, the body 410 and solid walls 451, which form the gas supply head 450, are held in relation to each other such that when the aperture 472 of the aperture plate 471 is positioned at (below) the gas outlet 453 of the gas supply head 450, one or more of the nozzles 414, 415, and 416 are exposed to the gas pressure from gas outlet 453 defined by the gas supply head 450. Such an alignment between the gas outlet 453 and the aperture plate 471 is referred herein as an open position.

The dimensions of the gas outlet 453 and of the aperture 472 (such as the width dimensions of the gas outlet 453, shown as 'a' at 455, and of the aperture 472, shown as 'b' at 473, and the respective length dimensions, not shown), in a plane substantially corresponding (e.g., parallel) to the plane of the first surface 411 of the body 410 are preferably greater than those of the largest orifice of the nozzles 414, 415, and 416 defined at the first surface 411 of the body 410.

However, when the aperture plate 471 is displaced in relation to the gas supply head such that the aperture 472 is moved away from the gas outlet 453 in either direction, the aperture plate 471 prevents pressure of gas admitted into the gas supply head 450 from being communicated into the nozzle pattern 420 via the gas outlet 453. This shift of the aperture 472 in relation to the gas outlet 453 is referred herein as a closed position and its example may be seen in FIG. 4a.

Whilst the aperture plate 471 is in this closed position, the ejectant supply assembly 430 can be translated (by any of a number of known translation means, not shown) relative to the body 410 towards and past the nozzles 414, 415, and 416. In FIG. 4a, such translation is indicated by arrow 435. At the same time, the ejectant 433a travels from the ejectant supply body 431 towards the body 410 by the way of the resilient seal member 432. Thus, translation of the ejectant supply assembly 430 relative to the body 410, past the nozzles 414, 415, and 416, whilst under pressure exerted by the resilient seal member 432, results in quantities of the ejectant 433a being supplied from the ejectant supply body 431 into the nozzles 414, 415, and 416. This translation also leaves the portion of the second surface 412 passed by the resilient seal member 432 substantially free from the ejectant.

Once the nozzles 414, 415, and 416 have been filled, the aperture plate 471 is translated (moved) through the open position so as to temporarily align the aperture 472 with the gas outlet 453 to allow the pressure of gas admitted into the gas supply head 450 to be briefly communicated via the gas outlet 453 and through the aperture 472 to the nozzle pattern 420. In FIG. 4a, such translation is indicated by arrow 474.

In some embodiments, to minimise gas consumption by the apparatus 400, whenever gas is supplied under pressure to the gas supply head 450, close proximity is maintained between a portion 457 of the walls 451 that defines the gas outlet 453 and the surface 477 of the aperture plate 471. Close proximity may also be maintained between the surface 478 of the aperture plate 471 and the first surface 411 of the body 110 whenever the aperture plate 471 is in the open position. In this open position, the aperture 472 allows the pressure of the gas exiting the gas supply head 450 through the gas outlet 453 to reach one or more of the nozzles 414, 415, and 416 through the aperture 472 of the aperture plate 471.

The close proximity of the gas supply head 450, the aperture plate 471, and the body 410 is characterised by small values of a gap 'g2' shown at 475 between the body 410 and the aperture plate 471 and a gap 'g3' shown at 476 between the aperture plate 471 and the gas outlet 453. The gaps 'g2' and 'g3' can be set to zero by providing a sliding seal (not shown) between the aperture plate 471 and each of the gas supply head 450 and the body 410. In some embodiments, the sliding seal is realised by incorporating a layer of solid lubricant or low-friction material, such as high density polyethylene, into or onto the surfaces 477 and 478 of the aperture plate 471.

In use, an external supply of gas (not shown) supplies gas into the gas inlet 452 at a pressure sufficiently above ambient pressure to cause the ejectant to eject from the nozzles 414, 415 and 416 within that time during which the aperture 472 passes the gas outlet 453 to expose those nozzles to the gas pressure at the gas outlet 453. The gas may be supplied to the gas supply head 450 with continuous or pulsatile pressure by means and methods similar to those described with reference to FIGS. 1a to 1c.

In a general scenario with either or both gaps 'g2' and 'g3', shown at 475 and 476 respectively, being non-zero, the pressure versus flow rate characteristic of the gas supply is selected to ensure that the gas pressure at the gas outlet 453 remains sufficiently above ambient pressure to eject the ejectant from the nozzles 414, 415, and 416.

By providing the aperture plate 471 and positioning the aperture plate 471 in the closed position whilst filling the nozzles 414, 415, and 416, the repeatability of volume of ejectant 433a filled into those nozzles can be improved and the over-filling of the nozzles can be more easily prevented. In addition, whether gas is supplied to the apparatus 400 with continuous or pulsatile pressure, such an apparatus is particularly useful in ejecting patterns of ejectant onto a stationary substrate.

In some embodiments, a composite aperture plate configured to provide an aperture of a variable width 'd' is used instead of the aperture plate 471 in the apparatus 400. An example of a composite aperture plate 480 is shown schematically in FIG. 4b. The composite aperture plate 480 includes plates 481 and 491 that cooperate to form an aperture 482 of a variable width 'd'. The plate 491 incorporates slidably cooperating plate members 493a and 493b such that sliding of the plate member 493b relative to the plate member 493a varies the width 'd' of the aperture 482. As shown in FIG. 4b, the plate member 493a has a recess for slidably receiving the plate member 493b such that a top surface 494b of the plate member 493b and a recess surface 494a of the plate member 493a are held (by a number of known means, not shown) in sliding contact with little or no gas leakage therebetween. In the composite aperture plate 480 shown in FIG. 4b, a bottom surface 495b of the plate member 493b and a top surface 495a of the plate member 493a are arranged to be substantially coplanar.

In use, translation of the plate member 493b relative to the plate member 493a in the direction of an arrow 484, whilst maintaining a sliding, low-leakage contact, is achieved by a number of means (not shown) and provides the aperture 482 of the variable width 'd'. This dynamic variation in the width 'd' enables control of the time duration of exposure of the ejectant within a nozzle to the pressure of the supply gas according to the needs of a particular ejectant (e.g., a liquid of high or low viscosity), whilst using gas supply means that supply gas at constant pressure.

Figure 5A:
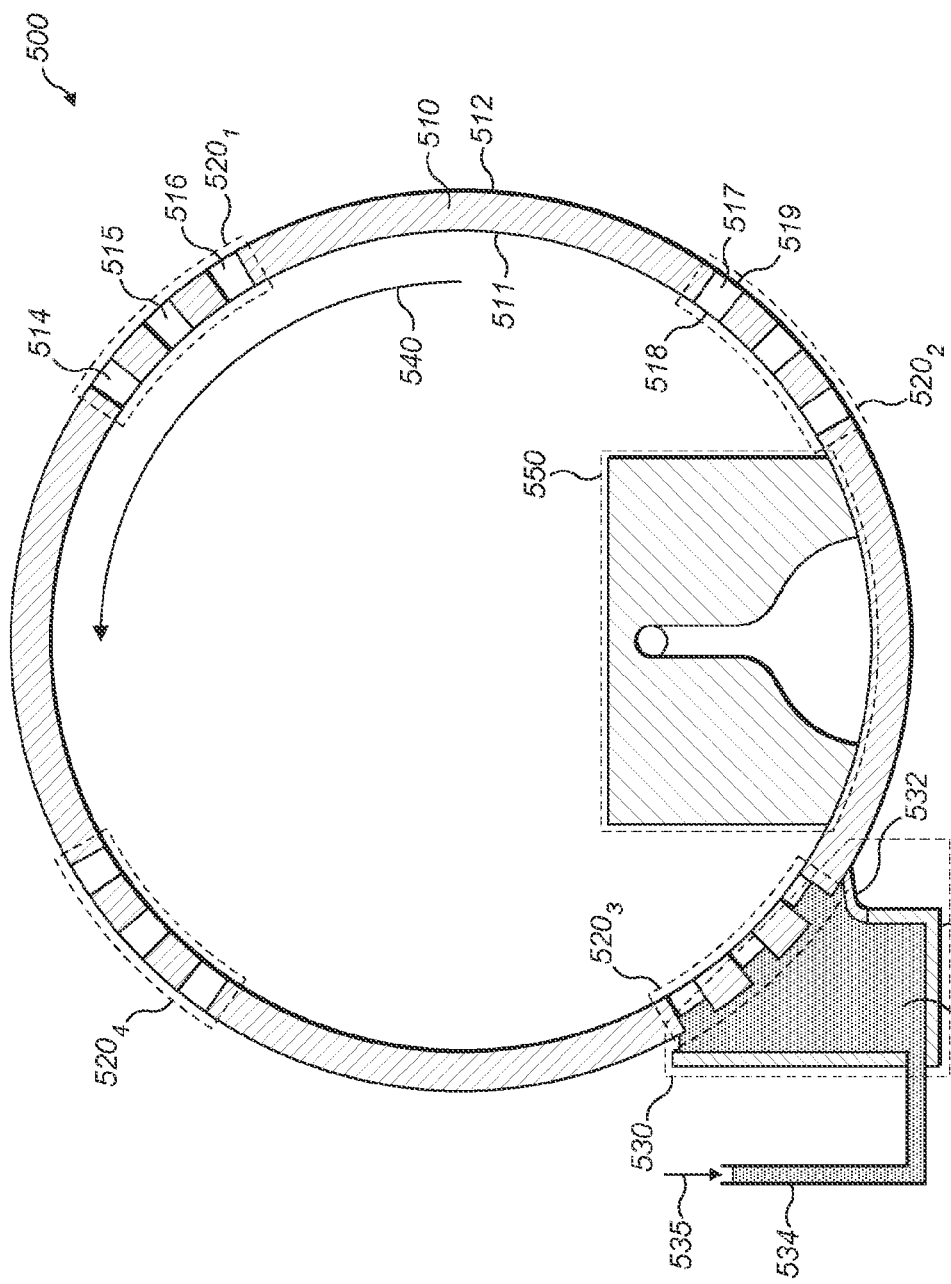
FIGS. 5a and 5b show cross-sectional views of another apparatus for ejecting discrete quantities of ejectant, according to some embodiments.
Figure 5B:
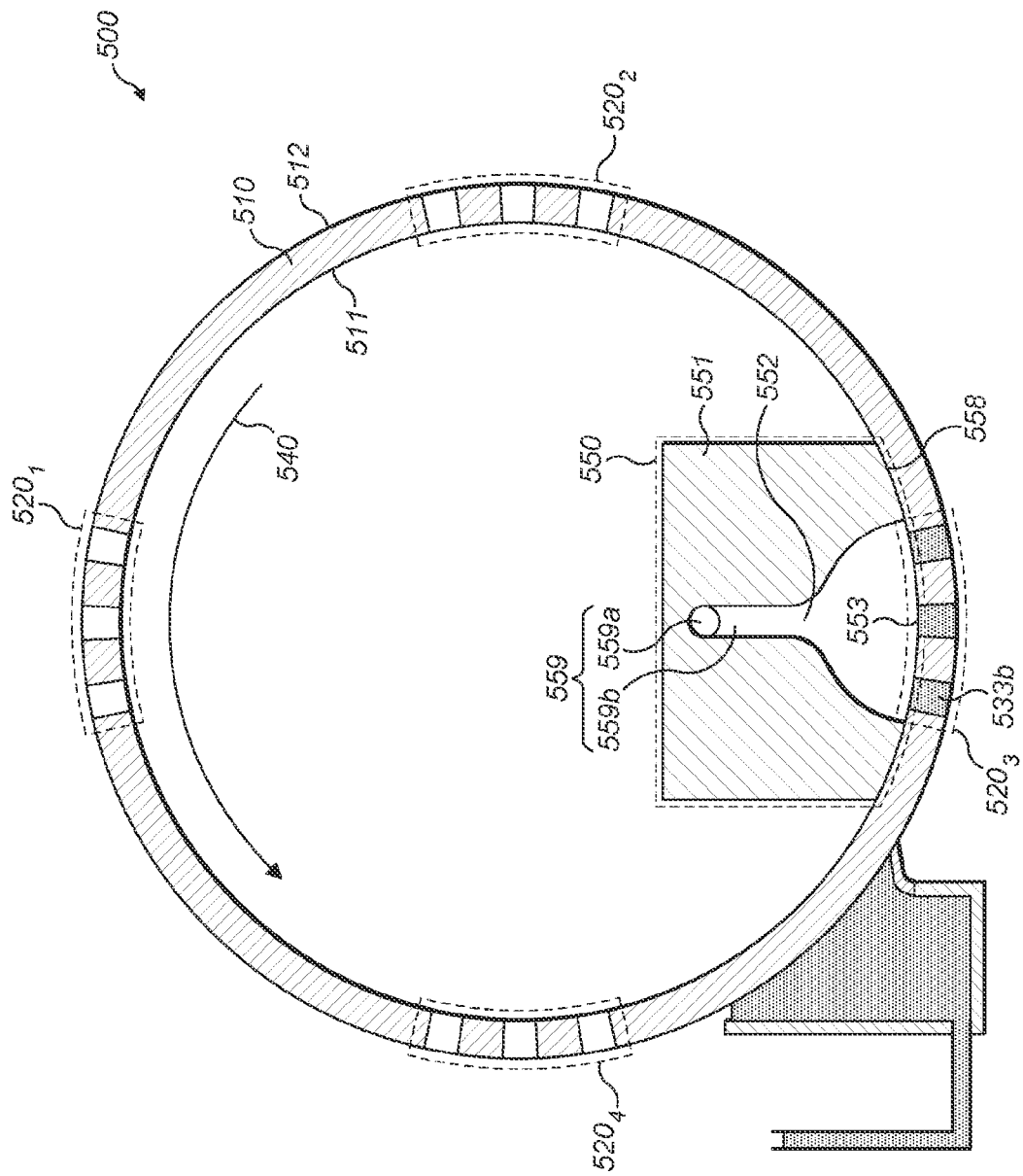

FIGS. 5a and 5b show cross-sectional views of an apparatus 500 with a cylindrical body 510 (also referred to as a roller or a drum) for ejecting discrete quantities of ejectant, according to some embodiments. The roller 510 has a number of nozzles 514, 515, and 516 penetrating through the thickness of the roller from a first, inner surface 511 of the roller 510 to a second, outer surface 512 of the roller 510. The nozzles 514, 515, and 516 form a nozzle pattern $520_1$.

As shown, the roller 510 may include a number of similar nozzle patterns $520_1$, $520_2$, $520_3$, and $520_4$ penetrating through the thickness of the roller 510 from the first surface 511 to the second surface 512. Each of the nozzles 514, 515, and 516 within these patterns is defined by a conduit 517 having a first orifice 518 at the first surface 511 and a second orifice 519 at the second surface 512, as shown by way of example for one of the nozzles in the pattern $520_3$.

In use, the roller 510 is rotated about its axis by auxiliary means (not shown), for example, in the anticlockwise direction shown by a directional arrow 540. As the roller 510 rotates, so does each of the nozzle patterns $520_1$-$520_4$, and thus each of these nozzle patterns successively passes an ejectant supply assembly 530, which thereby supplies ejectant 533 into nozzles within these patterns.

In the embodiments of FIGS. 5a and 5b, the ejectant supply assembly 530 includes a housing 531, which is adjacent to and extends along but not beyond the axial length of the roller 510. The housing 531 holds ejectant 533 for supplying such ejectant into the nozzle patterns of the roller 510. A resilient seal member 532 (e.g., a wiper blade seal) extends from at least one side of the housing 531, along the length of the housing, and forms a pressure-bearing sliding contact seal against the second surface 512 of the roller 510. Peripheral (or end) seals (not shown) are provided between the ends of the housing 531 and the roller 510. The ejectant supply assembly 530 further includes an ejectant feed pipe 534 for transporting the ejectant 533 from a remote ejectant supply into the housing 531, as shown by arrow 535.

The housing 531, the resilient seal member 532, the end-seals (not shown), and the second surface 512 of the roller 510 create an ejectant supply assembly 530. This ejectant supply assembly 530 can be filled and maintained filled with the ejectant 533 which is supplied to the ejectant supply assembly 530 via the feed pipe 534 from the remote ejectant supply, as indicated by arrow 535. In use, the ejectant supply assembly 530 is maintained filled with the ejectant 533, whilst rotation of the roller 510 causes each of the nozzle patterns $520_1$, $520_2$, $520_3$, and $520_4$ to successively pass the ejectant supply assembly 530. As the nozzles of the nozzle patterns (the nozzle pattern $520_3$, in FIGS. 5a and 5b) pass the ejectant supply assembly 530, the ejectant supply assembly 530 fills such nozzles with the ejectant 533 partially or fully, depending on desired settings and requirements. The resilient seal member 532 both contributes to such filling in a manner similar to that described above with reference to FIGS. 1a to 1c, and also removes the ejectant from the second surface 512 of the roller 510 as the roller 510 passes the pressure-bearing contact seal between the resilient seal member 532 and the roller 510. In consequence, the nozzles within each nozzle pattern (for example, the pattern $520_3$) are successively partially- or fully-filled with a discrete quantity 533b of the ejectant 533.

FIGS. 5a and 5b show that the continued rotation of the roller 510 in the direction 540 brings each nozzle pattern $520_1$, $520_2$, $520_3$, and $520_4$ successively underneath the gas supply head 550 formed with solid walls 551. FIG. 5b shows the nozzle pattern $520_3$ in such a position. The first orifice 518 of each of the nozzles 514, 515, and 516 within the nozzle pattern $520_3$ is thereby exposed to the pressure of gas at the gas outlet 553 of the gas supply head 550. A substantially gas-tight seal is formed between a surface 558 of the walls 551 proximate to the first surface 511 and the first surface 511 of the roller 510. This seal may for example be achieved by minimising the gap between those surfaces or, alternatively, by providing a sliding seal (not shown) between those surfaces.

In use, the gas supply head 550 admits gas supplied to the gas supply head 550 via a conduit 559 (e.g., a drilling) formed within the walls 551. The conduit 559 may be formed of a number of connected conduits, such as conduits 559a and 559b shown in FIG. 5b. There, the conduit 559a directs gas from one end of the roller 510 towards the inner cavity of the gas supply head, whilst the conduit 559b redirects the gas downwards to a gas inlet 552 of the gas supply head 550. In this manner, the gas is directed to the gas outlet 553.

The pressurised gas supply (not shown) is arranged to provide a pressure sufficiently above ambient pressure so as to eject the ejectant 533b from the nozzles 514, 515, and 516 of the nozzle pattern $520_3$, for at least that time duration needed for ejection to occur. As discussed above, the ejection is caused by the pressure difference created between respective orifices of each nozzle due to the pressurised gas supplied from the gas outlet 553.

Exposure of one or more of the nozzles in nozzle pattern $520_3$ to that pressure for that time (i.e., the combination of time and pressure) thereby ejects the ejectant 533b from those nozzles. In this manner, a pattern of ejectant according to the pattern of nozzles may be deposited onto a nearby substrate.

Example Implementations

Figure 5C:
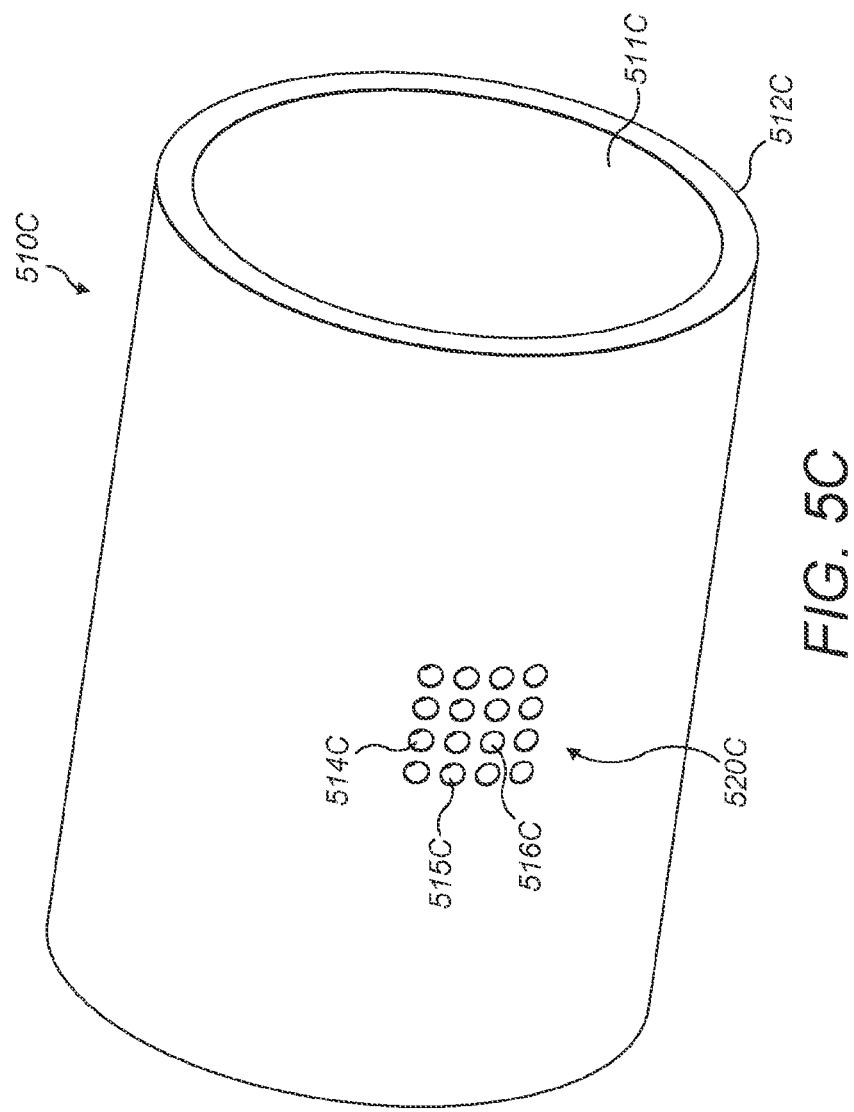
FIG. 5c shows schematically a body suitable for use in an apparatus for ejecting discrete quantities of ejectant such as the apparatus discussed with reference to FIGS. 5a and 5b, according to some embodiments.

FIG. 5c shows schematically a body 510c suitable for use in an apparatus 500 for ejecting discrete quantities of ejectant, such as the apparatus 500 discussed with reference to FIGS. 5a and 5b, according to some embodiments. As shown in the figure, the body 510c is a roller or drum that has a number of nozzles, such as nozzles 514c, 515c, and 516c penetrating through the thickness of the roller from a first, inner surface 511c of the roller 510c to a second, outer surface 512c of the roller 510c. The nozzles 514c, 515c, and 516c form a nozzle pattern 520c.

The nozzle pattern 520c shown in FIG. 5c is a 4-by-4 array of nozzles. However, nozzle patterns, their symmetry or lack thereof, and how many nozzles form a particular pattern can vary, for example depending on the intended use of the apparatus 500. For example, a drum designed to jet bonding adhesive onto a medical dressing may have a nozzle pattern that prints a line of closely spaced dots around the edge of the dressing and a relatively sparse density of dots within the dressing.

Figure 6:
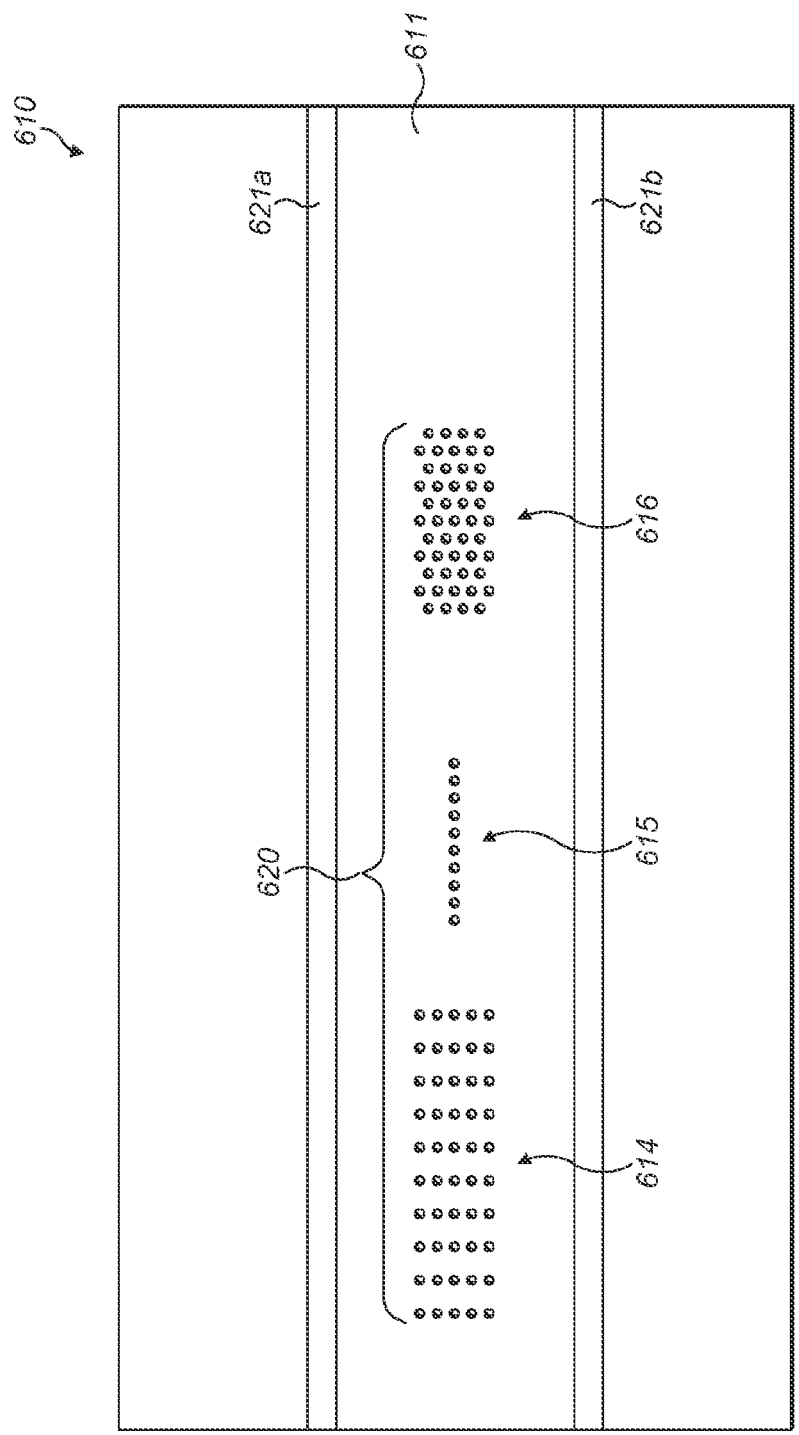
FIG. 6 shows schematically a body suitable for use in a device for ejecting discrete quantities of ejectant, such as the device discussed with reference to FIGS. 1a, 1b, and 1c, according to some embodiments.

FIG. 6 shows a body 610 suitable for use in a device for ejecting discrete quantities of ejectant, such as the apparatus 100 discussed with reference to FIGS. 1a to 1c, according to some embodiments. The body 610 has a number of nozzles 614, 615, and 616 defined therein. In particular, each nozzle is defined by a conduit extending through the body 610 between corresponding orifices defined at a first surface 611 of the body 610 and a second surface 612 of the body 610. The nozzles 614, 615, and 616 form a nozzle pattern 620. In FIG. 6, the nozzle pattern 620 includes 109 nozzles.

The body 610 may further include guides defined therein for guiding the motion of a gas supply head across the nozzle pattern 620 (discussed further with reference to FIG. 7). Such guides may for example take a form of slots 621a and 621b shown in FIG. 6.

In some example implementations, the body 610 is made of brass and has thickness of 3 mm and overall dimensions of 76 mm by 150 mm. Further, the nozzle pattern 620 is disposed within an area 10 mm by 100 mm, the nozzles are about 0.4 mm in diameter, with a centre-to-centre spacing of about 2 mm. The nozzles 614, 615, and 616 can for example be formed using a drill to drill the body 610 in order to create the nozzles 614, 615, and 616.

Figure 7A:
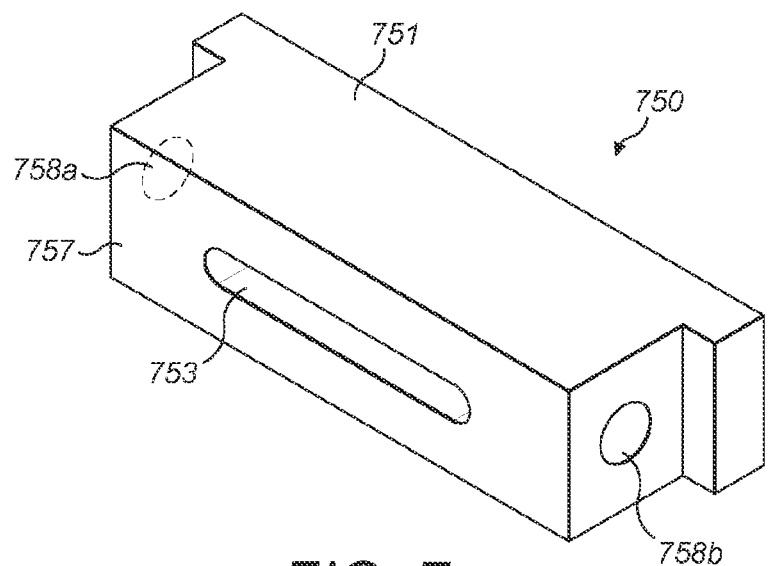
FIGS. 7a and 7b show schematically a gas supply head suitable for use in combination with the body shown in FIG. 6, according to some embodiments.
Figure 7B:
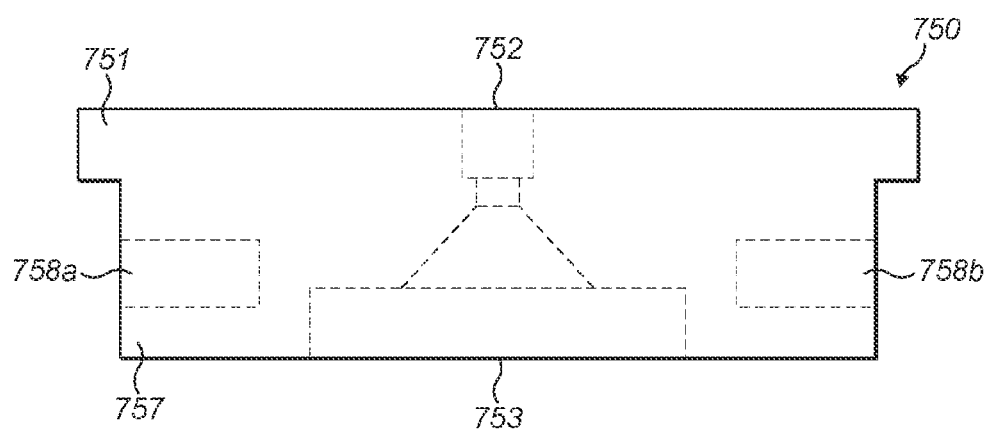

FIGS. 7a and 7b show a gas supply head 750 suitable for use in combination with the body 610, according to some embodiments. More specifically, FIG. 7a shows an isometric view of the gas supply head and FIG. 7b shows a cross-sectional view of the gas supply head 750.

Similar to the gas supply head 150 discussed with reference to FIGS. 1a to 1c, the gas supply head 750 is formed of solid walls 751, which define a gas outlet 753 and a gas inlet 752. The gas outlet 753 is defined at an end portion 757 of the gas supply head 750 that is can be positioned adjacent to the body 610 whilst the gas inlet 752 is formed at an end portion of the gas supply head 750 opposite the end portion 757.

Figure 8:
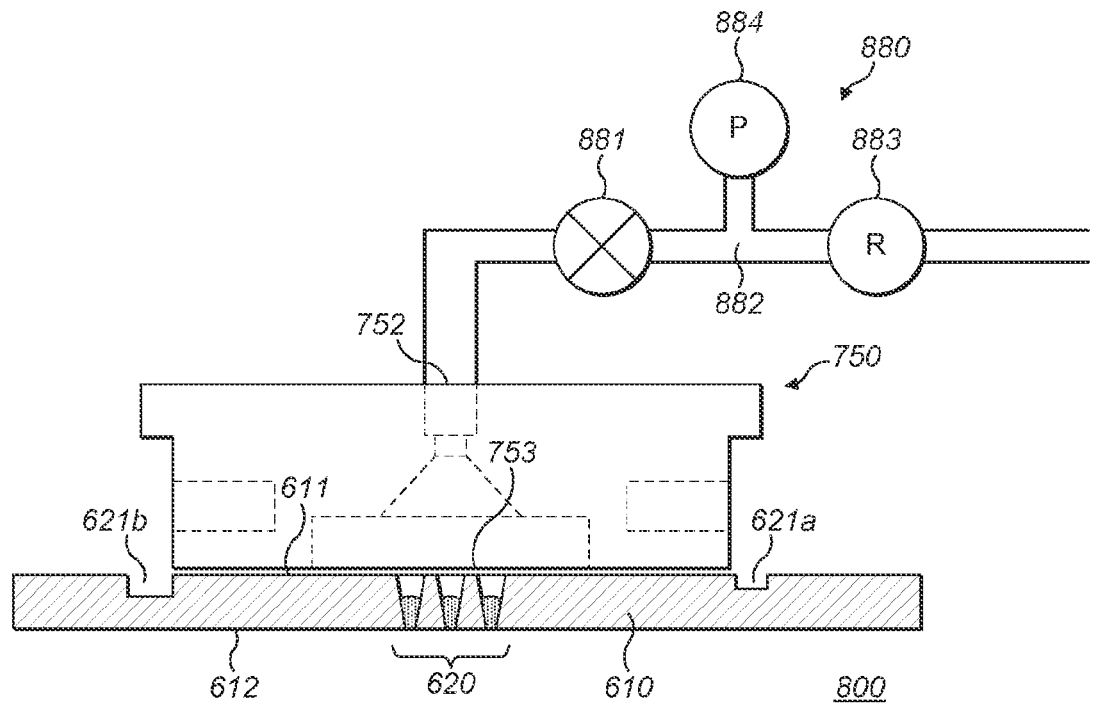
FIG. 8 shows schematically an apparatus for ejecting discrete quantities of ejectant that incorporates the gas supply head of FIGS. 7a and 7b and the body of FIG. 6, according to some embodiments.

However, unlike the gas supply head 150 of FIGS. 1a to 1c, which is stationary, the gas supply head 150 is movable relative to the stationary body 610 (shown in FIGS. 6 and 8). That is, in the example implementations discussed with reference to FIGS. 6 to 8, the relative movement of the gas supply head and the body is caused by translational movements of the gas supply head, instead of the translational movement of the body as discussed with reference to FIGS. 1a to 1c.

Further, fixing points 758a and 758b (e.g., drillings) are provided on two opposite sides of the gas supply head 750 to allow for various components, such as rails (not shown), to be attached to the gas supply head 750. Such rails may, for example, be configured to fit into the slots 621a and 621b so as to guide the motion of the gas supply head 750 relative to the body 610.

In some example implementations, the gas supply head 750 has dimensions of 32 mm in length, 5 mm in width, and 10 mm in height. The gas outlet 753 has dimensions of 16 mm in length and 2 mm in width in the plane that substantially corresponds (shown in FIG. 8 as being parallel) to the plane of the first surface 611 of the body 610, when in use.

FIG. 8 depicts a device 800 for ejecting discrete quantities of ejectant that incorporates the gas supply head 750 of FIGS. 7a and 7b and the body 610 of FIG. 6. As shown in FIG. 8, in the device 800, whilst it is in use, the body 610 is positioned below the gas supply head 750 and in movable relation with the body 610 so as to move across the nozzle pattern 620.

To provide for supply of pressurised gas, the gas supply head 750 of the device 800 is connected to a gas supply system 880. The gas supply system 880 includes a valve 881, which connects the gas supply system 880 to the gas inlet 752 of the gas supply head 750. In the gas supply system 880, the valve 881 is connected to a pressure regulator 883 via a pipe 882. The pressure regulator 883 is connected to a reservoir of compressed gas, such as air (not shown), which is maintained by a compressor (not shown) at pressure (e.g., greater than 800 kN/m$^2$). The pressure in the pipe 882 is monitored using a pressure meter 884. The pressure regulator 883 is set such that when the valve 881 is closed, the pressure in the pipe 882 is in the range 10 kN/m$^2$ to 1000 kN/m$^2$ above ambient pressure, for example 70 kN/m$^2$ above ambient pressure, as measured by the pressure meter 884. Once the nozzles have been filled or part-filled, for example in the manner discussed with reference to FIGS. 1a to 1c, the valve 881 is opened and the gas supply head 750 is applied, manually or by means of automation hardware, to the first surface 611 of the body 610 and then is swept across the body 610, traversing the nozzle pattern 620.

In a number of experiments with the device 800, the gas supply head 750 was moved at a velocity of between 0.05 m/s and 5 m/s relative to the body 610. As the area of the gas outlet 753 crossed the nozzles within nozzle pattern 620 in turn, the nozzles became exposed to the pressure of the gas supply, which has caused ejection of the ejectant from the nozzles.

If the substrate onto which the ejectant is being ejected is stationary relative to the body 610, then the ejectant forms a pattern on the substrate that replicates the nozzle pattern 620. If however the substrate is moved relative to the body 610 during the ejection, then the pattern on the substrate is transformed from the nozzle pattern 620 by either stretching or compression in the direction of the relative motion. Motion control of the substrate relative to the body 610 can be achieved by a combination of motors, stages and electronic control circuits, such as those used to control the motion of the gas supply head 750 relative to the body 610.

A range of materials, including various paints and inks were ejected in this manner using these devices and other test devices built similar to the device 800. These devices were made from acrylic and the nozzles were laser-machined. The number of nozzles varied and was in the range 10 to 50 nozzles.

Their diameters were in the range of 0.3 mm to 0.5 mm and the thickness of the body was in the range of 0.5 mm to 3 mm. The gas supply heads were made from acrylonitrile butadiene styrene using 3D printing. The dimension of the gas outlet in a direction normal to the motion of the gas supply head relative to body varied in the range 10 mm to 50 mm and the dimension of the gas outlet in the direction parallel to the motion of the gas supply head relative to the body varied in the range of 1 mm to 5 mm.

In a number of conducted experiments, such devices were used to eject water-based paint (Multi-Surface Paint supplied by Bedec Products Ltd). The paint had a viscosity of $10^7$ mPas at a shear rate of $0.001$ $s^{-1}$ and a viscosity of $10^3$ mPas at a shear rate of $10$ $s^{-1}$. The nozzles were fully or partially filled by applying a drop of paint measuring 5 mm in diameter to the second surface of the body at one end of the body and wiping the paint across the second surface and the nozzle pattern using a resilient seal member, for example, in the manner described with reference to FIGS. 1a to 1c. The resilient seal members used were in the form of a polyvinylchloride sheet 5 mm in thickness, a stainless steel blade 0.4 mm in thickness, and a neoprene sheet 3 mm in thickness. The resilient seal member's width was sufficient to span the width of the nozzle pattern in the particular device (1 mm-5 mm) and its length was in the range 15-30 mm. The degree to which the nozzles were filled was influenced by the material properties of the ejectant used, the material properties of the resilient seal member, the angle between the resilient seal member and the body, and the relative speed of the resilient seal member to the body.

In a number of further conducted experiments, devices built according to principles and techniques described herein were used to eject adhesives (including hot melt adhesives), inks, glazes, varnishes, and other coating materials. These devices were made of brass and the nozzles were drilled. The number of nozzles varied and was in the range of 100 to 1000 nozzles. The nozzle diameters were in the range of 0.3 mm to 0.5 mm and the thickness of the body was 2 mm. The gas supply heads were made from brass, using machining processes. The dimension of the gas outlet in a direction normal to the motion of the gas supply head relative to the body was 22 mm and the dimension of the gas outlet in the direction parallel to the motion of the gas supply head relative to the body was 2 mm.

The nozzles were fully or partially filled by applying 0.2 ml-2 ml of ejectant on the second surface of the body at one end of the body and wiping the ejectant across the second surface and the nozzle pattern using a resilient seal member, for example, in the manner described with reference to FIGS. 1a to 1c. The resilient seal members used were in the form of a stainless steel blade 0.4 mm in thickness or a rubber sheet 3.5 mm in thickness. The resilient seal member's width was sufficient to span the width of the nozzle pattern in the particular device (10 mm-20 mm) and its length was in the range of 15-30 mm. The degree to which the nozzles were filled was influenced by the material properties of the ejectant used, the material properties of the resilient seal member, the angle between the resilient seal member and the body, and the relative speed of the resilient seal member to the body. When using hot melt adhesive, the body was heated to 150° C. prior to applying the adhesive. In addition, an air heater, placed between the source of compressed air and the gas supply head, was used to heat the air so that the passage of air through the body did not result in cooling of the body.

Figure 9:
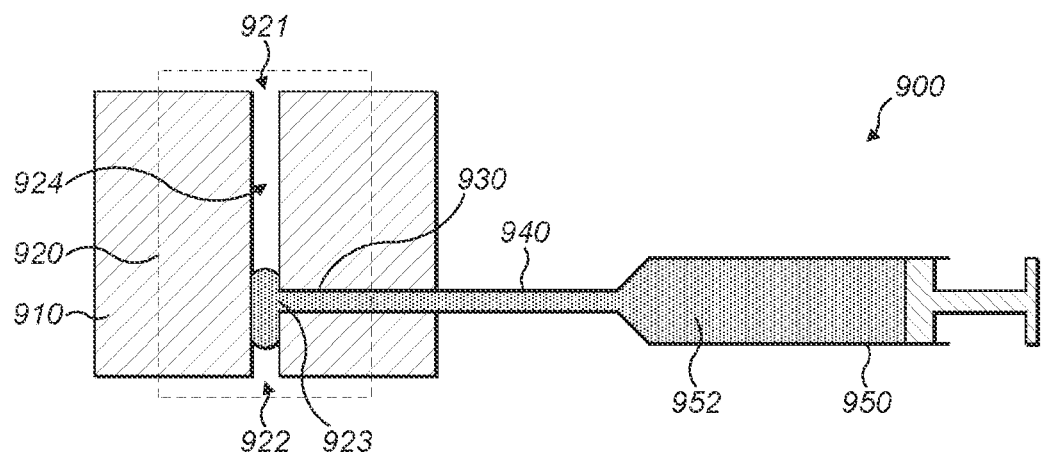
FIG. 9 shows schematically a cross-section of an ejectant supply assembly for supplying ejectant into nozzles of an ejector through auxiliary orifices, according to some embodiments.

FIG. 9 shows a cross-sectional view of a system 900, in accordance with some embodiments, for supplying ejectant, preferably liquid ejectant, into nozzles of an ejector through the auxiliary orifices defined in the sidewall of their conduits, such as described with reference to FIG. 2. The ejector includes a solid body 910 containing one or more nozzles 920 (only one nozzle is shown in FIG. 9). The nozzle 920 has a first orifice 921 and a second orifice 922 connected by a conduit 924. The solid body 910 further defines a side conduit 930, one end of which terminates at a side orifice 923 of the conduit 924 of the nozzle 920. The other end of the side conduit 930 is connected to a side pipe 940 through which ejectant 952 is supplied into the conduit 924 of the nozzle 920, for example, using a syringe 950. As described with reference to FIGS. 1a to 1c, ejection of the ejectant 952 from the nozzle 920 can be effected using a gas supply nozzle applied to the first orifice 921 so as to apply gas at pressure sufficient to cause ejection of the ejectant 952 through the second orifice 922.

In an example embodiment of the system 900, the conduit 924 is about 13 mm long, the first and second orifices have a diameter between 0.3 mm and 1.3 mm, and the side conduit 930 is a cross-drilling of diameter about 0.5 mm and length about 8 mm. The syringe 950 is a standard medical syringe of 10 millilitre (10 ml) capacity with Luer fitting driven by a syringe pump, model MS16A, made by Graseby Smiths Medical (not shown) to meter 200 nanolitre (200 nl) of the ejectant 952 into the conduit 924. In this example embodiment, gas pressures in the range 10 $kN/m^2$ to 100 $kN/m^2$ applied to orifice 921 were found to be adequate to eject a wide range of materials, including water-based dyes, paints, creams, and gels.

FIGS. 10a and 10b show another form of an ejectant supply assembly, according to some embodiments. More specifically, an ejectant supply assembly 1030 includes an ejectant supply body 1031 and two resilient seal members 1032a and 1032b that extend from the ejectant supply body 1031. As can be seen in FIGS. 10a and 10b, the ejectant supply assembly 1030 is configured to be placed adjacent to a body 1010 so as to provide for a pressure-bearing contact between the resilient seal members 1032a and 1032b and a second surface 1012 of the body 1010.

The two resilient seal members 1032a and 1032b and the ejectant supply body 1031 form a cavity (void, or the like) which holds ejectant shown at 1033a between the ejectant supply body 1031 and the second surface 1012 of the body 1010. The ejectant 1033a is supplied to ejectant supply assembly 1030 through an ejectant feed conduit 1034 in direction shown by arrow 1035 at a pressure above ambient pressure thereby to fill the cavity at a controlled pressure. Such pressure control may be provided, for example, by control of the hydrostatic head of the ejectant supply. The body 1010 defines a nozzle pattern 1020 comprising nozzles 1014, 1015, and 1016 each defined by a conduit connecting respective orifices at a first surface 1011 and the second surface 1012.

Translation of the body 1010 relative to the ejectant supply assembly 1030 in the direction 1040 causes quantities of the ejectant 1033a to be supplied from the ejectant supply assembly 1030 into the nozzles 1014, 1015, and 1016, such as shown in FIG. 10b at 1017, 1018, and 1019. The volume of the ejectant introduced into the nozzles 1014, 1015, and 1016 is determined by factors such as the flow properties of the ejectant, the dimensions of the nozzles, the pressure at which the ejectant is supplied, the spacing (in the direction of translation) of the resilient seal members 1032a and 1032b at the second surface 1012, and the speed at which the body 1010 translates relative to the ejectant supply assembly 1030. These factors are all known or may be controlled to ensure that the desired volume of ejectant 1033a enters the nozzles 1014, 1015 and 1016. Further, translation of the body 1010 past the resilient seal member 1032a can be arranged to leave the portion of the second surface 1012 which the resilient seal member 1032a has passed substantially free from the ejectant.

Figure 11:
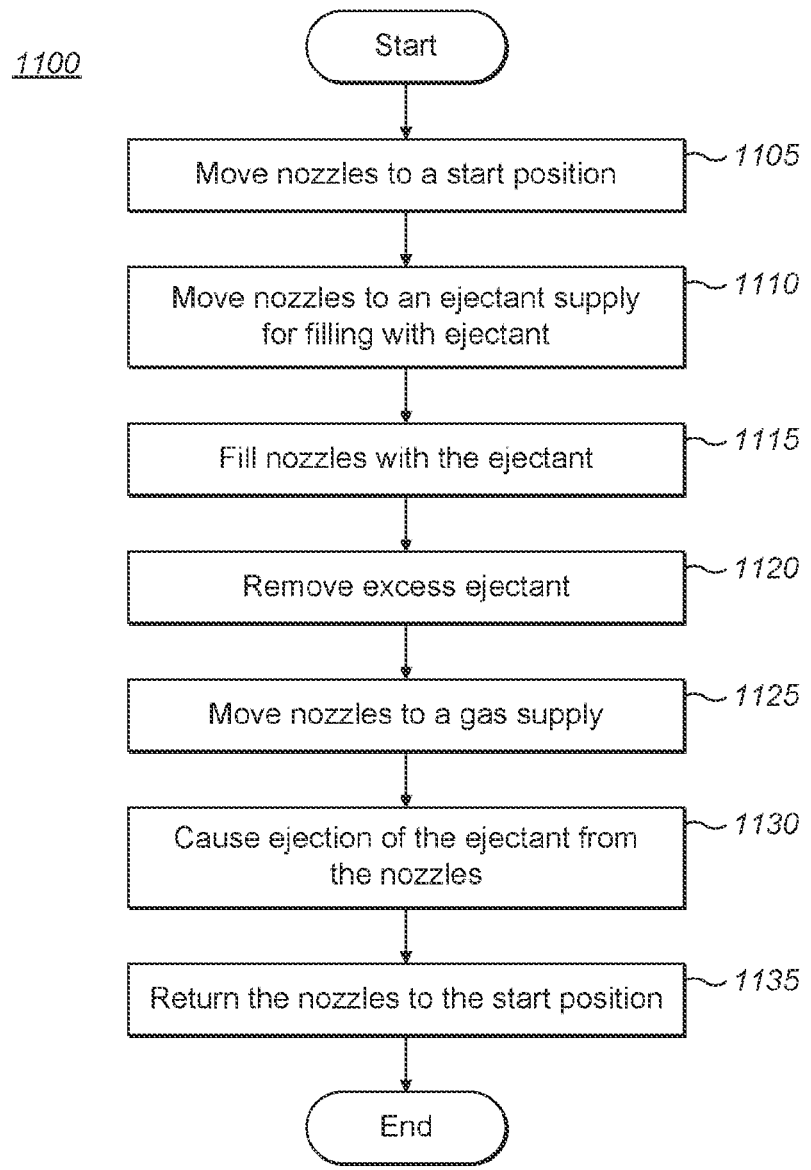
FIG. 11 depicts a flow diagram of a method for ejecting discrete volumes of ejectant, according to some embodiments.

FIG. 11 shows a flow-diagram of a method 1100 for methods for dispensing flowable materials (ejectant), for example onto a substrate, according to some embodiment. The method 1100 is suitable to be performed in an ejector having a plate-based geometry, such as the apparatus 100 discussed with reference to FIGS. 1a to 1c, or a drum-based geometry, such as the apparatus 500 discussed with reference to FIGS. 5a and 5b.

At step 1105, the nozzles of the ejector are moved to a start position. The start position is generally a position where the ejectant can neither be supplied to the nozzles nor ejected from the nozzles. At the start position, the nozzles are substantially empty. For example, with reference to FIGS. 1a to 1c, FIG. 1a depicts the apparatus 100 at what can be considered a start position.

As described above, the nozzles are defined in the body of the ejector. As such, movement of the nozzles generally involves motion of the body relative to a gas supply head and/or an ejectant supply assembly of the ejector. That is, the nozzles can be moved by moving the body 110 of the ejector containing the nozzles, the gas supply head 150, and/or the ejectant supply assembly 130.

At step 1110, the nozzles are further moved to a filling position so as to open the nozzles to the ejectant supply assembly and allow it to fill the nozzles, partially or fully. For example, with reference to FIGS. 5a and 5b, FIG. 5a shows the nozzles $520_3$ in the filling position.

At step 1115, the nozzles are filled with the ejectant by the ejectant supply assembly. In particular, as the nozzles are continued to be moved relative to and across the ejectant supply assembly, it fills them with the ejectant, for example, in the manner described above with reference to FIGS. 1a to 1c, 5a to 5b, and 10a to 10b. For example, FIG. 1b shows that once the nozzles 114, 115, and 118 have passed across the ejectant supply assembly 130, they are filled or partially filled with the ejectant 133b.

At step 1120, the excess ejectant is removed. This may for example be achieved using a resilient member of the ejectant supply assembly. As discussed, with reference to FIGS. 1a to 1c, the resilient seal member 132 may serve two purposes, i.e., guiding the supply of the ejectant from the ejectant supply assembly into the nozzles and also removing excess ejectant as it passes the nozzles. In this manner, the surface of the body at which the ejectant is supplied remains substantially clean. FIGS. 5a and 5b, and 10a and 10b and the corresponding description provide further details of how the excess ejectant can be removed.

At step 1125, the nozzles are moved to an ejecting position. In this position, the gas outlet of the gas supply head is aligned with (covers) the nozzles so as to allow the gas from the gas supply head to be supplied/communicated into the nozzles.

At step 1130, the ejectant is ejected/dispensed from the nozzles. This may for example be achieved in the manner described with reference to FIGS. 1a to 1c, 3a and 3b, 4a, 5a and 5b, 8, and 10a and 10b. Generally, the supply of gas from the gas supply head into the nozzles causes (effectuates) ejection of the ejectant from the nozzles. More specifically, supply of gas to the nozzles at pressure above ambient creates pressure difference between respective orifices of each nozzle, and thus causes ejection of the ejectant from such nozzles.

At step 1135, the nozzles are returned to the start position, and the steps 1110 to 1135 can then be repeated to provide for further refills of and ejections from the nozzles so as, for example, to provide for continuous printing on a web or a substrate that is not moving.

As described above, the method 1100 is applicable in the context of the plate-based and drum-based geometry of the ejector. To repeat the steps of the method 1100 in the context of the plate-based geometry, such as the ejector shown in FIGS. 1a to 1c, reciprocating motion is applied. To repeat the steps of the method 1100 in the context of the drum-based geometry, such as the ejector shown in FIGS. 5a and 5b, a continuous rotation is used.

The method 1100 is adaptable to embodiments in which there is no relative movement between the nozzles and the ejectant supply assembly or in which there is no relative movement between the nozzles and the gas supply assembly. In these embodiments, step 1110 moving the nozzles to the ejectant supply assembly or step 1125 of moving the nozzles to the gas supply assembly are be omitted. For example, in the embodiment described with reference to FIG. 2, it may be advantageous to have a fixed ejectant supply connected to the side conduit 285, in which case, step 1110 of the method 1100 is omitted. Similarly, in the embodiment described with reference to FIG. 9, the ejectant supply assembly may take the form of a syringe 950 permanently fixed to the side pipe 940, which in turn is permanently fixed to the side conduit 930. It may also be advantageous to fix a gas supply to the first orifice 921. In this particular example, then steps 1110 and 1125 would be omitted and a pulsatile source of gas can be used at step 1130 to cause ejection from the nozzles.

Thus, as discussed, relative motion of the gas supply head to the body enables ejection of the ejectant from the nozzles defined in the body, whilst the relative motion of the ejectant supply assembly to the body enables refill of the nozzles with the ejectant. Such relative motions can be effectuated for example by translational or rotational motion of the gas supply head, the nozzle-bearing body, and/or the ejectant supply assembly.

The translational motion (relative movement) of the gas supply head, the nozzle-bearing body, and/or the ejectant supply assembly can, for example, be realized by one or more motors connected to a linear stage. An electronic control circuit can be used to start, stop, and control the translational motion of the gas supply head, the nozzle-bearing body, and/or the ejectant supply assembly to provide for the relative motion between the three. A motor connected to a linear stage controlled by an electronic circuit is however merely an example of means by which the relative motion of the gas supply head, the nozzle-bearing body, and/or the ejectant supply assembly can be enabled and controlled. Other means can be used instead.

As described herein, the ejectant supply means, such as the ejectant supply assembly, can be configured to supply the ejectant to the nozzle(s) of the ejector at a pressure above ambient pressure. The ejectant flows into each of the nozzle (s) in response to the pressure difference between the supply pressure and the ambient pressure at the other, non-supply orifice(s) of the nozzle.

Generally, the pressure at which the ejectant is supplied by the ejectant supply means is controlled to affect (control) the rate at which the nozzle(s) fill with ejectant. Such pressure control can be used to reduce ejectant pressure to ambient pressure and thereby halt further supply of ejectant into the nozzle(s) once the desired volume of ejectant has been supplied into the one or more nozzles.

For a given pressure of ejectant supply means, the rate at which the nozzle(s) fill with ejectant in practice is also influenced by other parameters, most particularly by the viscosity of the ejectant and the dimensions of the nozzle and the non-supply orifice. Such parameters are generally themselves either fixed by the design of the body and the material of the ejectant.

However, the temperature at which the ejectant is supplied in general influences the viscosity of the ejectant. Therefore, in some example embodiments, the ejectant supply means are configured to supply the ejectant to the nozzle(s) at a controlled pressure above ambient pressure and at a controlled temperature. By controlling both the pressure and temperature of the ejectant supply a more precise control of the rate of filling of nozzle(s) with ejectant is enabled, allowing the nozzles to be filled with more precise quantities of ejectant, than when either the temperature or pressure is controlled alone.

Control of the volume of ejectant with which the nozzle(s) are filled enables control of the volume of ejectant subsequently ejected from those nozzle(s). This allows, for example, precise dosing of discrete volumes of ejectant onto substrates and economic use of ejectant material according to the intended purpose of depositing the ejectant onto the substrate. This approach is particularly advantageous in applications where it desirable to deposit small precise quantities, such as small precise quantities of adhesive onto printed circuit board with which to affix 'chip-on-board' electronic components onto printed circuit board or of pharmaceutical compounds upon the substrates of transdermal patches subsequently used for drug delivery through the skin.

To improve efficiency of the ejector, whether it is plate-based, drum-based, or is of some other geometry, in some embodiments, the body of the ejector is made from materials that provide for a stable and reasonably hard (not flexible) body. It is preferable to make the surfaces of the body reasonably smooth (i.e., substantially non-abrasive) so as to allow the gas supply head, and in particular, the ejectant supply assembly to slide in relation to the body without being excessively worn away, and also provide for a seal without excessive gas leakage. In general, the smoother the surface of the body is the better the seal is, and thus the more efficient is the ejector.

It is also preferable to use corrosion-stable materials (i.e., stable to oxidation and degradation) to manufacture the components of the ejector, and in particular to manufacture the body of the ejector. What materials are used however may depend, for example, on the intended use of the ejector, such as the nature of the ejectant and volumes to be ejected by the ejector.

If the ejector employs a pulsatile gas supply to supply pressurised gas to the gas supply head, in some embodiments, the gas supply head has small inner dimensions and is preferably stiff (in the sense of having very low volumetric compliance). This may be achieved by using materials having a high Young's modulus, e.g., metals, glasses, ceramics, and carbon fibre composites, to manufacture the gas supply head.

The described ejectors enable dispensing of discrete quantities of ejectant onto a substrate, web, or other suitable surface. In some embodiments, a gap is maintained between the body of the ejector and the substrate (web, or other suitable surface) onto which the ejectant is to be deposited. Therefore, droplet(s) of the ejectant ejected from the respective nozzle(s) of the body traverse the gap (such as an air gap) before being deposited onto the substrate (web, or other suitable surface).

Such a separation gap ensures no contact between the body and the substrate, thereby (i) avoiding wear in use of the second surface of the body that otherwise may arise by such contact, (ii) allows the deposition of ejectant upon delicate substrates (such as cotton) or lightweight substrates (such as fabric gauze) or weak or brittle substrates (such as thin semiconductor wafers of silicon, gallium arsenide or other semiconductor), and/or (iii) allows serial deposition of discrete quantities of ejectants without the need for the prior drying or curing of the previous deposited quantity. This latter benefit accrues whether each subsequent deposited quantity is formed of the same or different ejectant material as prior-deposited quantities, and whether each subsequent deposited quantity is deposited directly onto the previous deposited quantity or onto some other region of the substrate.

As described herein, a fluid ejector can have multiple nozzles. In some example embodiments the multiple nozzles are formed within the body in a fixed pattern—'nozzle template'.

A nozzle template allows deposition of discrete quantities of ejectant onto substrates in a fixed pattern corresponding to the pattern of nozzles in the template. This provides a simple means by which complex patterns of ejectant can easily be deposited. For example, a curved or shaped pattern of ejectant can be deposited upon the substrate using a corresponding fixed nozzle template.

In some embodiments, the fluid ejector has a body having only a single nozzle. A single nozzle embodiment is particularly useful and advantageous, for example, in the case of compact industrial equipment, in which only individual 'dots' of ejectant need to be deposited upon a substrate at various controllable locations. One such an example is a compact fluid ejector located on the end of the arm of an industrial robot that is used to deposit small precise quantities of adhesive onto locations of a printed circuit board. The locations are determined by the movement of the robot arm according to software instructions for adhesive droplet placement. Such adhesive 'dots' are used to affix 'chip-on-board' electronic components onto printed circuit board before those components are permanently fixed and electrically connected, most typically using 'flow-soldering' techniques.

The described ejectors and associated methods and their variations extend the practical applications of ejection of discrete quantities of ejectants to a wider range of ejectants than available ejectors and methods. By way of example, such applications include, but are not limited to:

depositing glaze on ceramic tiles using the ejector ejecting a carrier liquid suspension of solid glaze particles to make glazed tiles;

depositing silver frit on silicon in production of solar panels;

depositing solder paste on circuit boards when manufacturing electronic circuits;

depositing varnish on printing materials in production of printed packaging, book cover, magazines, and the like;

depositing hot melt adhesive for the manufacture of packaging and personal hygiene products;

depositing paint, paint mixtures, ultraviolet-curable paint on metal parts in productions of automobiles, ships, and airplanes;

depositing adhesive on carbon fibre to produce pre-impregnated carbon fibre; and depositing latex solution on cardboard or metal packaging to make tactile packaging, e.g., braille packaging for pharmaceutical products.

While only certain features of the invention have been illustrated and described herein, many modifications and changes will occur to those skilled in the art.

For example, in some of the embodiments described above, an ejectant supply assembly is configured to supply ejectant into nozzles through the same orifices that are subsequently used to eject the ejectant from the nozzles, such as through the second orifices of the device 100 as described with reference to FIGS. 1a to 1c. In some of the described embodiments, the ejectant supply assembly is configured to supply the ejectant into the nozzles through auxiliary orifices defined in the sidewalls of the conduits defining the nozzles, for example as described with reference to FIGS. 2 and 9.

Yet, in some other embodiments, the ejectant supply assembly is configured to supply the ejectant by other means, for example, through the orifice that becomes exposed to the gas from the gas supply head during the ejection stage of the fluid ejector, such as through the first orifices of the device 100 as described with reference to FIGS. 1a to 1c. Therefore, an ejectant supply assembly, for example, of form similar to that of the ejectant supply assembly 130 shown and described with reference to FIGS. 1a to 1c would be disposed on the opposite side of the body 110 to supply the ejectant 133a into the nozzles 114, 115 and 116 through their first orifices (as defined by the intersection of the nozzles 114, 115 and 116 with the first surface 111), rather than, as shown, through their second orifices.

Similarly, an ejectant supply assembly of form similar to that of the ejectant supply assembly 430 shown and discussed with reference to FIG. 4, may be disposed on the opposite side of the body 410 thereby to supply the ejectant 433a into the nozzles 414, 415 and 416 through their first orifices rather than, as shown, through their second orifices. In this case, the ejectant supply assembly may be incorporated within a second aperture within the aperture plate 471, or may be separate therefrom. Further, an ejectant supply assembly of form similar to that of the ejectant supply assembly 530, shown in and described with reference to FIGS. 5a and 5b, may be disposed on the interior side of roller 510 thereby to supply the ejectant into the nozzles of the nozzle pattern $520_1$, $520_2$, $520_3$, and $520_4$ through their first orifices rather than, as shown, through their second orifices.

In the preferred embodiments, the time interval between the supply of ejectant into the nozzles and the subsequent exposure of that ejectant to the ejecting gas pressure at the gas outlet is sufficiently short that, after supply, the ejectant remains in the nozzles until that exposure. In the case of a plate-like body of 1.4 mm thickness, with nozzles of orifice diameter of 500 μm, that time interval for many practical ejectant liquids can be many minutes.

In some applications, it is undesirable to have a short time interval between the supply of ejectant into the nozzles and its subsequent ejection from the nozzles. In such applications the presently described embodiments are particularly suitable for patterned deposition of liquid ejectants having high viscosity and/or high surface tension and/or emergent from nozzles having a small second orifice.

Therefore, although the above particular descriptions refer to many embodiments of the invention, it will be understood by those skilled in the art that many other embodiments fall within the scope of the present invention.

For example, some implementations of the present invention provide for a fluid ejector for ejecting discrete volumes of ejectant, the ejector comprising: a body having opposing first and second surfaces and a plurality of nozzles defined between the first and second surfaces, each nozzle defined by a conduit extending through the body to connect a first orifice defined at the first surface of the body and a second orifice defined at the second surface of the body; an ejectant supply means for supplying ejectant to each of one or more of a plurality of nozzles via a supply orifice of the nozzle; and a gas supply means for supplying a pressurised gas to the one or more nozzles through the respective one or more first orifices, wherein, in use, the gas supply means supplies gas to the first orifices of the one or more nozzles at a pressure above ambient pressure, thereby causing ejection of the ejectant from the one or more nozzles through the second orifices of the one or more nozzles.

This fluid ejector advantageously enables dispensing of discrete quantities of fluids in a manner that is tolerant of varying operating conditions of practical industrial applications. Furthermore, the described fluid ejector extends the practical applications of ejection of discrete quantities of ejectants to a wider range of ejectants, a wider range of ejection rates, and a wider range of volumes of ejected ejectant than those known in the ink-jet art. By using a supply of pressurised gas, greater ejection energies can be provided than is provided by known ink-jet actuation means. Such use of pressurised gas also provides physical displacements of the ejectant that are larger than those provided by known ink-jet actuation means, thereby advantageously increasing the largest ejectant volume that can be ejected. Additionally, for liquid ejectants, no effective removal of dissolved gases from the ejectant is required, whilst for viscous ejectants, the viscous forces opposing ejectant ejection can be minimised by, for example, feeding the ejectant directly into the conduit immediately adjacent the ejection orifice, rather than via long capillary feed tubes, as known in the art.

In some example embodiments, the ejectant supply means are configured to supply the ejectant to the one or more nozzles at a pressure above ambient pressure.

For liquid ejectants, supply at a pressure above ambient pressure eliminates the reliance of the 'refill' of the nozzles after ejection upon the weak force of surface tension. This enables satisfactory supply (i) of liquid ejectants having a greater range of viscosities and/or (ii) of ejectants into a greater range of orifice and nozzle sizes and thereby a greater range of volumes of ejected ejectant and/or (iii) of ejectants at a faster rate than conventionally used.

In some example embodiments, the ejectant supply means and the body are configured to translate relative to each other, the fluid ejector further comprising translational means for causing relative translation of the ejectant supply means to the body.

This translatable arrangement enables filling of nozzles with the ejectant at one region of the body whilst simultaneously ejecting the ejectant from nozzles at a separate region of the body. This, in turn allows continuous and rapid operation of fluid ejectors. One such example is a fluid ejector having a body in the form of a rotating annular roller together with a fixed gas supply head and a fixed ejectant supply means located at different positions relative to the roller.

In some example embodiments, the ejectant supply means comprises: an ejectant supply holder; and at least one resilient member extending from the ejectant supply holder and configured to provide for pressure-bearing contact between the resilient member and one of the first and second surfaces of the body such that, in use, the resilient member guides the ejectant into the one or more nozzles.

In the described configuration of the ejectant supply holder with the at least one resilient member, supply of the ejectant into the nozzles under pressure is advantageously induced by the relative motion between the resilient member and the body.

In some example embodiments, the at least one resilient member is further configured, in use, to remove an excess of the ejectant from the surface of the body it contacts.

By using the at least one resilient member to remove an excess of the ejectant from the surface with which the resilient member is in contact, build-up of the ejectant on the contacted surface is prevented. If the contacted surface is the second surface, an excess of the ejectant remaining on that surface adjacent to the second orifices may, by coming into contact with the ejectant being ejected from the second orifices cause variability in the ejection characteristics (such as speed or direction of ejection) of the ejectant ejected from those orifices. Removal of the excess using the resilient member prevents such problems from arising.

If the contacted surface is the first surface, an excess of the ejectant remaining on that surface may fill the gap between the first surface of the body and those surfaces of the solid walls defining the end portion of the gas supply head with the ejectant, and thereby cause a number of drawbacks. For example, relative motion of the gas supply head and the body can be inhibited. As a second example, for ejectants containing or comprising abrasive materials, filling of the gap can result in undesirable wear of those surfaces when the gas supply head and body are translated relative to each other. Removal of the excess allows these drawbacks to be avoided.

If the contacted surface is either the first or the second surface, removal of the excess also aids the use of liquid ejectants that contain volatile components and ejectants that, over time, form or deposit solids. Without removal of the excess, many examples of such ejectants, can, over time, partially or completely block orifices by forming a solid layer of material on the contacted surface that encroaches on those orifices.

In some example embodiments, the at least one resilient member comprises two resilient members extending from the ejectant supply holder to form a cavity for holding the ejectant, the ejectant supply assembly further defining a feed conduit that allows, in use, supply of the ejectant into the cavity at a pressure above ambient pressure, responsive to the presence of nozzles adjacent to the ejectant holding cavity.

The arrangement with the two or more resilient members allows a greater range of ejectant supply pressures to be provided than can be provided using a single resilient member. The two resilient member arrangement thereby enables the satisfactory supply (i) of liquid ejectants having a greater range of viscosities and/or (ii) of ejectants into a greater range of orifice and nozzle sizes and thereby a greater range of volumes of ejected ejectant and/or (iii) of ejectants at a faster rate, thereby enabling faster operation of the fluid ejector, than conventional fluid ejectors can provide.

In some example embodiments, for each for each of the one or more nozzles, the supply orifice is the second orifice; and the at least one resilient member is in pressure-bearing contact with the second surface of the body such that, in use, the resilient member guides the ejectant into the one or more nozzles through the respective second orifices.

In some example embodiments, for each of the one or more nozzles, the supply orifice of the nozzle is different from the first orifice of the nozzle.

By supplying the ejectant and gas through different orifices, the overall configuration of the fluid ejector is simplified and no special arrangement for managing supplies of different materials through the same orifices are needed.

In some example embodiments, for each of the one or more nozzles, the supply orifice is defined in a side of the conduit defining the nozzle.

This arrangement is particularly helpful if the gas supply head is fixed relative to the body and also to enable provision of an ejectant supply means that is capable of precise metering.

In some example embodiments, the ejectant supply means comprises a metering device configured to supply the ejectant to the supply orifice defined in the side of the conduit defining the nozzle.

This arrangement is advantageous in applications requiring delivery of precise amounts of ejectant.

In some example embodiments, for each of the one or more nozzles, the supply orifice is the second orifice.

In some practical applications, filling of the gap between the first surface of the body and those surfaces of the solid walls defining the end portion of the gas supply head with the ejectant can result in a number of drawbacks. For example, for liquid ejectants containing volatile components, relative motion of the gas supply head and the body can be inhibited by evaporation of the volatile components. This is especially likely after extended periods of non-use of the fluid ejector. As a second example, for ejectants containing or comprising abrasive materials, filling of the gap between the first surface and the end portion of the gas supply head can result in undesirable wear of those surfaces when the gas supply head and body are translated relative to each other. By supplying the ejectant via the second orifice, the ejectant can be supplied in such manner that it does not emerge through the first orifice, thus allowing the above drawbacks to be avoided.

In some example embodiments, the gas supply means comprise a gas supply head defining a gas outlet for directing the pressurised gas to the first orifices of the one or more nozzles, and wherein the gas supply head and the body are configured to remain stationary relative to each other in use.

This arrangement of the gas supply head allows for more efficient use of gas from the supply of pressurised gas. This stationary arrangement allows the gas supply head to be integrated with the body, thereby providing for a simple implementation of a fluid ejector capable of depositing repeated patterns onto a substrate.

In some example embodiments, the gas supply means comprise a gas supply head defining a gas outlet for directing the pressurised gas to the first orifices of the one or more nozzles.

The gas supply head allows for more efficient use of gas from the supply of pressurised gas.

In some example embodiments, the gas supply head and the body are configured to translate relative to each other, the fluid ejector further comprising translational means for causing relative translation of the gas supply head to the body such that, in use, the gas outlet passes over the first orifices of the one or more nozzles.

In some example embodiments, the body and/or the gas supply head are movable to cause the relative translation of the gas supply head to the body.

These movable configurations enable supply of ejectant to the first orifices at a location different to that of the gas supply head. Therefore, the nozzles can be filled without exposing them, during filling to the gas pressure of the gas supply head. Such an arrangement simplifies repeated supply of ejectant to the orifices of the one or more nozzles.

In some example embodiments a dimension of the gas outlet in a direction of the relative translation of the gas supply head to the body is dynamically adjustable such that, in use, the dimension is adjusted to control a time duration of the one or more nozzles being exposed to the pressure of the gas at the gas outlet.

This example configuration enables, for a range of speeds of relative motion between the gas supply head and the body, the time duration during which ejectant within the nozzles is exposed to the pressurised gas supplied by the gas supply head to be advantageously held nearly constant, thereby aiding consistent ejection characteristics within that range of speeds.

In some example embodiments, a gap between a portion of the gas supply head defining the gas outlet and the first surface of the body is formed.

The configuration with the gap between the gas supply head and the first surface of the body provides for a simple implementation of the fluid ejector in which wear between the first surface of the body and those surfaces of the solid walls defining the end portion of the gas supply head is prevented.

In some example embodiments, the gap is such that, if the plurality of nozzles is empty, gas flow through the gap is smaller than gas flow through the plurality of nozzles.

Such sizing of the gap provides for relatively efficient use of gas supplied by the gas supply head.

In some example embodiments, the gap is such that, if the plurality of nozzles is filled with the ejectant, gas flow through the gap is smaller than gas flow through the plurality of nozzles on ejecting the ejectant.

Such sizing of the gap provides for still greater efficiency of gas utilisation from the gas supply head.

In some example embodiments, the gas supply head is configured to receive pulsatile supply of gas at a pressure above ambient pressure.

The pulsatile gas supply configuration allows the timing of gas pressurisation to be synchronised with the timing at which ejectant-filled nozzles are placed at the gas supply head and thereby exposed to that gas pressure. In this manner, wasteful discharge of pressurised gas (either through the nozzles or through a gap between a portion of the gas supply head defining the gas outlet and the first surface of the body) can be minimised, thereby enabling still greater efficiency of gas utilisation from the gas supply head. Further, this configuration simplifies ejectant supply if the gas supply head is fixed with respect to the body.

In some example embodiments, the gas supply head is configured to receive continuous supply of gas at a pressure above ambient pressure.

The continuous gas supply configuration is a simpler and more straight-forward configuration of the fluid ejector.

In some example embodiments, the discrete volumes of the ejected ejectant are limited by the interior volume of the one or more nozzles.

Using the interior volume of the one or more nozzles to limit the ejectant in this way provides for efficient use of the ejectant material.

In some example embodiments, the body is a rotatable annular roller.

The roller configuration facilitates continuous deposition of the ejectant onto substrates that take the form of continuously moving webs.

In some example embodiments, the body is a translatable plate.

The plate configuration is particularly useful in combination with a pulsatile supply of gas.

In some example embodiments, the fluid ejector further comprises an aperture member, defining at least one aperture and positioned between the body and the gas supply means, wherein the aperture member is translatable such that, in use: for supplying of ejectant to the one or more nozzles, the aperture member is translated to a position in which the aperture member prevents exposure of the one or more nozzles to the pressure of the gas from the gas supply means, and for ejecting the ejectant from the one or more nozzles, the aperture member is translated to a position in which the at least one aperture of the aperture member is aligned with the one or more nozzles to expose the one or more nozzles to the pressure of the gas from the gas supply means.

The use of a translatable aperture in the fluid ejector advantageously allows using a continuous supply of gas whilst controlling the timing of ejection from the nozzles.

Some implementations of the present invention provide for a method for ejecting discrete volumes of ejectant. The method comprises ejecting the ejectant onto a substrate or a web using any of the above-described fluid ejectors.

According to some example embodiments, ejecting comprises: supplying the ejectant to the one or more nozzles from the ejectant supply means; and supplying the gas to the one or more nozzles through the respective one or more first orifices at a pressure above ambient to cause the one or more nozzles to eject the ejectant onto the web or the substrate.

According to some example embodiments, supplying the ejectant comprises: translating the one or more nozzles relative to the ejectant supply means to expose the first or second orifices of the one or more nozzles to supply of the ejectant from the ejectant supply means when the ejectant supply means pass the orifices.

According to some example embodiments, supplying the gas comprises: translating the one or more nozzles relative to the gas supply means to expose the first orifices of the one or more nozzles to the pressure of the gas from the gas supply means when the gas supply means pass the first orifices, thereby causing the nozzles to eject the ejectant from one or more nozzles through the respective second orifices.

According to some example embodiments, the method further comprises: repeating the supplying the ejectant and supplying the gas steps at least once.

According to some example embodiments, ejecting comprises: supplying the ejectant to the one or more nozzles from the ejectant supply means; and supplying the gas to the one or more nozzles through the respective one or more first orifices at a pressure above ambient to cause the one or more nozzles to eject the ejectant onto the web or substrate.

Some other implementations provide for a method for ejecting discrete volumes of ejectant, the method comprising: supplying with ejectant one or more nozzles of a plurality of nozzles defined in a body between opposing first and second surfaces of the body, each nozzle defined by a conduit extending through the body to connect a first orifice defined at the first surface of the body and a second orifice defined at the second surface of the body, wherein the ejectant is supplied at a pressure above ambient pressure to each of the one or more nozzles through a supply orifice of the nozzle; and supplying a gas at a pressure above ambient pressure to the one or more nozzles through the first orifices of the one or more nozzles to cause the one or more nozzles to eject the ejectant through the second orifices.

According to some example embodiments, the ejectant is supplied to the one or more nozzles using the ejectant supply assembly and the method further comprising translating the ejectant supply assembly relative to the body to allow supply of the ejectant from the ejectant supply assembly to each of the one or more nozzles through the first or second orifice of the nozzle.

According to some example embodiments, translating the ejectant supply assembly relative to the body comprises moving the body to cause the relative translation of the ejectant supply assembly to the body.

According to some example embodiments, translating the ejectant supply assembly relative to the body comprises moving the ejectant supply assembly to cause the relative translation of the ejectant supply assembly to the body.

According to some example embodiments, the ejectant supply assembly comprises an ejectant supply holder and at least one resilient member extending from the ejectant supply holder and configured to provide for pressure-bearing contact between the resilient member and one of the first and second surfaces of the body; and translating the ejectant supply assembly relative to the body causes the at least one resilient member pass over the orifices at the surface contacted by the at least one resilient member, thereby guiding the ejectant into the one or more nozzles through the orifices at the surface contacted by the at least one resilient member.

According to some example embodiments, the method further comprises: removing an excess of the ejectant supplied to the one or more nozzles from the surface of the body contacted by the at least one resilient member using the at least one resilient member.

According to some example embodiments, the at least one resilient member comprises two resilient members extending from the ejectant supply holder to form a cavity for holding the ejectant, the ejectant supply assembly further defining a feed conduit, and the method further comprises supplying the ejectant into the cavity at a pressure above ambient pressure, responsive to the presence of nozzles adjacent to the ejectant holding cavity.

According to some example embodiments, for each of the one or more nozzles, the supply orifice is the second orifices; the at least on resilient member is in pressure-bearing contact with the second surface of the body; and translating the ejectant supply assembly relative to the body causes the at least one resilient member pass over the second orifices of the one or more nozzles, thereby guiding the ejectant into the one or more nozzles through the second orifices.

According to some example embodiments, for each of the one or more nozzles, the supply orifice of the nozzle is different from the first orifice of the nozzle.

According to some example embodiments, for each of the one or more nozzles, the supply orifice is defined in a side of the conduit defining the nozzle.

According to some example embodiments, wherein supplying one or more nozzles with the ejectant comprises supplying the ejectant to each of the one or more nozzles through the supply orifice of the nozzle using a metering device.

According to some example embodiments, for each of the one or more nozzles, the supply orifice is the second orifice; and translating the ejectant supply assembly relative to the body allows supply of the ejectant from the ejectant supply assembly to the one or more nozzles through the second orifices.

According to some example embodiments, the gas is supplied to the one or more nozzles by a gas supply head adjacent to the first surface of the body, the gas supply head defining a gas outlet for directing the gas to the first orifices of the one or more nozzles, and the gas supply head remains stationary relative to the body whilst the method is executed.

According to some example embodiments, the gas is supplied to the one or more nozzles by a gas supply head adjacent to the first surface of the body, the gas supply head defining a gas outlet for directing the gas to the first orifices of the one or more nozzles.

According to some example embodiments, the method further comprises translating the gas supply head relative to the body to cause the gas outlet to pass over the first orifices of the one or more nozzles.

According to some example embodiments, translating the gas supply head relative to the body comprises moving the body to cause the relative translation of the gas supply head to the body.

According to some example embodiments, translating the gas supply head relative to the body comprises moving the gas supply head to cause the relative translation of the gas supply head to the body.

According to some example embodiments, the method further comprises adjusting dynamically, in response to a speed of the relative translation of the gas supply head to the body, a dimension of the gas outlet in a direction of the relative translation of the gas supply head to the body to control a time duration of the one or more nozzles being exposed to the pressure of the gas at the gas outlet.

According to some example embodiments, a gap is formed between a portion of the gas supply head defining the gas outlet and the first surface of the body.

According to some example embodiments, the gap is such that, if the plurality of nozzles is empty, a gas flow through the gap is smaller than a gas flow through the plurality of nozzles.

According to some example embodiments, the gap is such that, if the plurality of nozzles is filled with the ejectant, gas flow through the gap is smaller than a gas flow through the plurality of nozzles on ejecting the ejectant.

According to some example embodiments, the method further comprises receiving by the gas supply head pulsatile supply of gas at a pressure above ambient pressure.

According to some example embodiments, the method further comprises receiving by the gas supply head continuous supply of gas at a pressure above ambient pressure.

According to some example embodiments, the method further comprises repeating the supplying the ejectant and supplying the gas steps at least once.

According to some example embodiments, the discrete volumes of the ejectant ejected from the one or more nozzles are limited by the interior volume of the one or more nozzles.

According to some example embodiments, the body is a rotatable annular roller, and the method further comprises rotating the annular roller to cause the first orifices of the one or more nozzles to pass in front of the gas supply head.

According to some example embodiments, the body is a rotatable annular roller, and the method further comprises rotating the annular roller to allow supply of the one or more nozzles with the ejectant.

According to some example embodiments, the body is a translatable plate.

According to some example embodiments, an aperture member, having at least one aperture, is disposed between the body and the gas supply head, wherein the aperture member is translatable and the method further comprises: translating the aperture member to a position in which the aperture member prevents exposure of the one or more nozzles to the pressure of the gas from the gas supply means to allow supply of ejectant to the one or more nozzles; and translating the aperture member to a position in which the at least one aperture of the aperture member is aligned with the one or more nozzles to expose the one or more nozzles to the pressure of the gas from the gas supply means to cause ejection of the ejectant from the one or more nozzles.

The above described embodiments and implementations enable ejection of defined volumes of ejectant particularly because no further ejectant is introduced into the nozzle as a consequence of the ejection event. Rather, the nozzles are refilled during a subsequent separate operation. This is unlike the conventional arrangements in which further ejectant stored in a chamber in fluid communication with the nozzles flows into the nozzle. Consequently there is no need to maintain careful balance between the timing of pressurisation pulses required for droplet ejection and the time duration required for pressure-reduction of a chamber according to the particular ejectant viscosity, size of the droplet outlet, the flow profile of the valve controlling the sudden gas pressurisation as it opens, the liquid fill level within the chamber, or the ambient temperature. Similarly there is no need to eliminate reverberating pressure pulses within the chamber. The disclosed fluid ejectors and associated ejection methods are therefore more tolerant of varying operating conditions expected in practical industrial application.

For example, some of the described embodiments provide for implementations (such as the variations described with reference to FIG. 4) in which the volume of ejectant entering any nozzle during the 'fill' part of the cycle, and therefore the volume subsequently ejected from that nozzle during the 'eject' part of the cycle, may be metered or controlled by closing the first orifice of that nozzle during the fill operation.

Further, as described, the disclosed fluid ejectors and associated methods are not limited to gravitational liquid feed to the nozzles, but instead utilise positive-pressure feed into the nozzles. This increases the rate at which the nozzles can be refilled for the next ejection event (for the 'eject' part of the cycle), thereby allowing greater ejection rates and corresponding greater productivity in industrial applications.

Furthermore, the disclosed fluid ejectors and associated methods enable ejection and deposition onto a target substrate or web of fluid volumes larger than the volumes typically required in an inkjet application. For example, volumes larger than 1 nanolitre (1 nl) of ejectant as droplets can be ejected using the described fluid ejector.

Additionally, some of the variations disclosed herein (such as the variation described with reference to FIG. 1) allow fluid ejector's implementations that do not require seals contacted by ejectant between relatively moving parts of the fluid ejector without sacrificing the quality of the ejected patterns or efficiency of the fluid ejectors.

Furthermore, the described fluid ejectors and associated methods enable the gas pressures, nozzle dimensions and time that the ejectant is exposed to the ejecting gas pressure to be easily varied to enable ejection of a wide range of ejectants as single droplets rather than as sprays. This in turn facilitates depositing of high quality patterns of ejectant upon various substrates and webs.

The invention claimed is:

1. An ejector for ejecting ejectant, the ejector comprising:
a rigid body having opposing first and second surfaces and at least one nozzle defined between the first and second surfaces, each of the at least one nozzle defined by a conduit extending through the rigid body to connect a first orifice defined at the first surface of the rigid body and a second orifice defined at the second surface of the rigid body;
an ejectant supply device for supplying ejectant to each of one or more of the at least one nozzle, wherein the ejectant supply device comprises a housing for holding the ejectant and an ejectant feed pipe connected to a lower portion of the housing for supplying the ejectant to the housing; and
a gas supply device for supplying a gas to the one or more nozzles through the one or more first orifices, the gas supply device defining a gas outlet,
wherein:
the ejectant supply device is operable to supply the ejectant to each of the one or more nozzles from the housing at a pressure above ambient pressure, and
the gas supply device is operable to supply gas to the one or more first orifices of the one or more nozzles at a pressure above ambient pressure, wherein for each of the one or more nozzles a pressure difference created thereby between the first orifice and the second orifice of the nozzle causes ejection of the ejectant from the nozzle through the second orifice.

2. The ejector of claim 1, wherein the gas supply device and the rigid body are movable relative to each other, and wherein relative movement of the gas supply device and the rigid body exposes the one or more first orifices of the one or more nozzles to the gas outlet, enabling the gas supply device to supply gas to the one or more first orifices of the one or more nozzles at a pressure above ambient pressure.

3. The ejector of claim 1, wherein the ejectant supply device and the rigid body are movable relative to each other, and wherein the ejectant supply device comprises at least one resilient member extending from the housing and configured to provide for pressure-bearing contact between the resilient member and one of the first and second surfaces of the rigid body to guide the ejectant into the one or more nozzles.

4. The ejector of claim 3, wherein the at least one resilient member is further configured to remove an excess of the ejectant from the surface of the rigid body contacted by the at least one resilient member.

5. The ejector of claim 3, wherein the at least one resilient member comprises two resilient members extending from the housing to form a cavity for holding the ejectant, wherein the ejectant feed pipe is configured to supply the ejectant into the cavity at a pressure above ambient pressure when nozzles are adjacent to the ejectant holding cavity.

6. The ejector of claim 3, wherein the at least one resilient member is configured to be in pressure-bearing contact with the second surface of the rigid body to guide the ejectant into the one or more nozzles.

7. The ejector of claim 1, wherein the ejectant supply device is operable to supply the ejectant to each of the one or more nozzles through the first orifice or the second orifice.

8. An ejector for ejecting ejectant, the ejector comprising:
a rigid body having opposing first and second surfaces and a plurality of nozzles defined between the first and second surfaces and forming a continuous annular nozzle pattern, each of the plurality of nozzles defined by a conduit extending through the rigid body to connect a first orifice defined at the first surface of the rigid body and a second orifice defined at the second surface of the rigid body;
an ejectant supply device for supplying ejectant to each of one or more of the plurality of nozzles; and a gas supply device for supplying a gas to the one or more nozzles through the one or more first orifices, the gas supply device defining a gas outlet, wherein:

the ejectant supply device is operable to supply the ejectant to each of the one or more nozzles at a pressure above ambient pressure, and the gas supply device is operable to supply gas to the plurality of first orifices of the plurality of nozzles at a pressure above ambient pressure, wherein for each of the plurality of nozzles a pressure difference created thereby between the first orifice and the second orifice of the nozzle causes ejection of the ejectant from the nozzle through the second orifice onto a substrate to form a continuous deposition of ejectant on the substrate.

9. The ejector of claim 8, wherein one or more of the rigid body and the gas supply device are movable to cause relative movement of the gas supply device and the rigid body to expose the plurality of first orifices of the plurality of nozzles to the gas outlet, enabling the gas supply device to supply gas to the plurality of first orifices of the plurality of nozzles at a pressure above ambient pressure.

10. The ejector of claim 9, wherein the rigid body is a rotatable cylindrical rigid body, and the relative movement of the gas supply device and the rigid body is caused by rotation of the rotatable cylindrical rigid body.

11. The ejector of claim 8, wherein the gas supply device comprises a gas supply head defining the gas outlet for directing the gas to the first orifices of the one or more nozzles, wherein the gas supply head is configured to receive pulsatile supply of gas at a pressure above ambient pressure or continuous supply of gas at a pressure above ambient pressure.

12. The ejector of claim 11, wherein the gas supply head and the rigid body are configured to move relative to each other so as to maintain a constant separation between the first surface of the rigid body and a portion of the gas supply head defining the gas outlet.

13. The ejector of claim 8, wherein the ejectant supply device is operable to supply the ejectant to each of the plurality of nozzles through the first orifice or the second orifice.

14. A method for ejecting ejectant, the method comprising:

supplying with ejectant a plurality of nozzles defined in a rigid body between opposing first and second surfaces of the rigid body, the nozzles forming a continuous annular nozzle pattern, each of the plurality of nozzles defined by a conduit extending through the rigid body to connect a first orifice defined at the first surface of the rigid body and a second orifice defined at the second surface of the rigid body, wherein the ejectant is supplied at a pressure above ambient pressure to each of the plurality of nozzles; and supplying gas at a pressure above the ambient pressure to the plurality of first orifices of the plurality of nozzles, wherein for each of the plurality of nozzles, a pressure difference created thereby between the first orifice and the corresponding second orifice causes ejection of the ejectant from the respective nozzle through the second orifice onto a substrate to form a continuous deposition of ejectant on the substrate.

15. The method of claim 14, wherein supplying the gas at a pressure above the ambient pressure to the plurality of first orifices of the plurality of nozzles comprises moving the gas supply device and the rigid body relative to each other to expose the plurality of first orifices of the plurality of nozzles to a gas outlet defined by a gas supply device.

16. The method of claim 14, wherein the ejectant is supplied to the plurality of nozzles using an ejectant supply assembly, the method further comprising:

moving the ejectant supply assembly and the rigid body relative to each other to allow supply of the ejectant from the ejectant supply assembly to each of the plurality of nozzles.

17. The method of claim 14, wherein the gas is supplied to the one or more nozzles by a gas supply head adjacent to the first surface of the rigid body, the gas supply head defining the gas outlet for directing the gas to the first orifices of the one or more nozzles, and wherein the method further comprises:

receiving, by the gas supply head, pulsatile supply of gas at a pressure above ambient pressure or, continuous supply of gas at a pressure above ambient pressure.

18. The method of claim 17, wherein relative movement of the rigid body and the gas supply head causes the gas outlet to pass over the first orifices of the plurality of nozzles or the first orifices of the plurality of nozzles to pass over the gas outlet.

19. The method of claim 17, wherein a constant separation is maintained between the first surface of the rigid body and a portion of the gas supply head defining the gas outlet.

20. The method of claim 14, further comprising:

repeating at least once the steps of supplying the ejectant and supplying the gas at a pressure above the ambient pressure.

21. The method of claim 14, wherein the rigid body is a cylindrical rigid body, the method further comprising rotating the cylindrical rigid body to allow supply of ejectant to the plurality of nozzles and/or to cause relative movement of the gas supply device and the rigid body to allow supply of gas to the plurality of nozzles.

22. The method of claim 14, wherein the ejectant is supplied to each of the plurality of nozzles through the first orifice or the second orifice.

* * * * *